United States Patent
Ghosh et al.

(10) Patent No.: US 10,707,650 B2
(45) Date of Patent: Jul. 7, 2020

(54) HIGH-SPEED VCSEL DEVICE

(71) Applicant: Princeton Optronics, Inc., Mercerville, NJ (US)

(72) Inventors: Chuni Ghosh, West Windsor, NJ (US); Jean-Francois Seurin, Princeton Junction, NJ (US); Delai Zhou, Basking Ridge, NJ (US); Laurence Watkins, Pennington, NJ (US)

(73) Assignee: Princeton Optronics, Inc., Mercerville, NJ (US)

( * ) Notice: Subject to any disclaimer, the term of this patent is extended or adjusted under 35 U.S.C. 154(b) by 0 days.

(21) Appl. No.: 16/053,541

(22) Filed: Aug. 2, 2018

(65) Prior Publication Data

US 2019/0067909 A1 Feb. 28, 2019

Related U.S. Application Data

(62) Division of application No. 15/447,484, filed on Mar. 2, 2017, now abandoned.

(Continued)

(51) Int. Cl.
*H01S 5/183* (2006.01)
*H01S 5/042* (2006.01)
(Continued)

(52) U.S. Cl.
CPC ........ *H01S 5/18361* (2013.01); *H01S 5/0421* (2013.01); *H01S 5/187* (2013.01);
(Continued)

(58) Field of Classification Search
CPC .. H01S 5/105; H01S 5/18305; H01S 5/18361; H01S 5/18383; H01S 5/18397; H01S 5/309; H01S 5/3095
See application file for complete search history.

(56) References Cited

U.S. PATENT DOCUMENTS 5,574,738 A   11/1996  Morgan
5,781,575 A * 7/1998  Nilsson ............... H01S 5/18383
                                                     257/E33.069
(Continued)

FOREIGN PATENT DOCUMENTS

CN      104051957 A     9/2014
EP      0773614         5/1997
(Continued)

OTHER PUBLICATIONS

A.V. Rylyakov et al.,"A 40-Gb/s, 850-nm, VCSEL-Based Full Optical Link", OFC/NFOEC Technical Digest© 2012 OSA paper OTh1E.1.
(Continued)

*Primary Examiner* — Michael Carter
(74) *Attorney, Agent, or Firm* — Michael Best and Friedrich LLP

(57) ABSTRACT

A Vertical Cavity Surface Emitting Laser (VCSEL) includes a reflecting surface of the VCSEL. A gain region is positioned on the distributed Bragg reflector that generates optical gain. The gain region comprises a first and second multiple quantum well stack, a tunnel junction positioned between the first and second multiple quantum well stack, and a current aperture positioned on one of the first and second multiple quantum well stack. The current aperture confines a current flow in the gain region. A partially reflective surface and the reflective surface forming a VCSEL resonant cavity, wherein an output optical beam propagates from the partially reflecting surface.

28 Claims, 18 Drawing Sheets

Related U.S. Application Data

(60) Provisional application No. 62/303,632, filed on Mar. 4, 2016.

(51) Int. Cl.
*H01S 5/187* (2006.01)
*H01S 5/22* (2006.01)
*H01S 5/30* (2006.01)
H01S 5/026 (2006.01)
H01S 5/062 (2006.01)
H01S 5/42 (2006.01)
H01S 5/34 (2006.01)

(52) U.S. Cl.
CPC ........ *H01S 5/1833* (2013.01); *H01S 5/18383* (2013.01); *H01S 5/18386* (2013.01); *H01S 5/2215* (2013.01); *H01S 5/3095* (2013.01); H01S 5/026 (2013.01); H01S 5/06226 (2013.01); H01S 5/18305 (2013.01); H01S 5/18311 (2013.01); H01S 5/18355 (2013.01); H01S 5/34 (2013.01); H01S 5/423 (2013.01)

(56) References Cited

U.S. PATENT DOCUMENTS

| | | | | |
|---|---|---|---|---|
| 6,829,281 B2* | 12/2004 | Deng | ............... | H01S 5/183 372/43.01 |
| 7,333,735 B1 | 2/2008 | Goorjian | | |
| 7,916,768 B2 | 3/2011 | Chang et al. | | |
| 7,949,024 B2 | 5/2011 | Joseph | | |
| 8,031,752 B1 | 10/2011 | Johnson et al. | | |
| 8,451,695 B2* | 5/2013 | Olson | ............... | H01S 5/026 369/13.01 |
| 2001/0043629 A1* | 11/2001 | Sun | ............... | H01S 5/426 372/43.01 |
| 2001/0050934 A1* | 12/2001 | Choquette | ............... | B82Y 20/00 372/50.11 |
| 2002/0093024 A1* | 7/2002 | Lee | ............... | H01S 5/18388 257/98 |
| 2004/0101009 A1 | 5/2004 | Johnson et al. | | |
| 2006/0140235 A1 | 6/2006 | Kim | | |
| 2007/0053399 A1 | 3/2007 | Johnson et al. | | |
| 2007/0153867 A1 | 7/2007 | Muller | | |
| 2009/0196319 A1* | 8/2009 | Hori | ............... | H01S 5/18316 372/50.124 |
| 2010/0128749 A1 | 5/2010 | Amann et al. | | |
| 2013/0209110 A1 | 8/2013 | Fattal et al. | | |
| 2015/0311673 A1* | 10/2015 | Wang | ............... | H01S 5/18355 372/27 |

FOREIGN PATENT DOCUMENTS

| | | |
|---|---|---|
| EP | 2297826 | 3/2011 |
| WO | 2014088502 | 6/2014 |
| WO | 2015155188 A2 | 10/2015 |

OTHER PUBLICATIONS

D. Kuchta et al, "64Gb/s Transmission Over 57m MMF Using an NRZ Modulated 850nm VCSEL", 2014 Optical Fiber Communication Conference, Paper# Th3C.2.

D. Kuchta et al, "A 55Gb/s Directly Modulated 850nm VCSEL-Based Optical Link", IEEE Photonics Conference 2012 IPC 2012) Post Deadline Paper PD 1.5.

D. Kuchta et al, "A 71-Gb/s NRZ Modulated 850-nm VCSEL-Based Optical Link" IEEE Photonics Technology Letters, Mar. 15, 2015, vol. 27, No. 6.

Kevin Lear et al, "Progress and Issues for High Speed VCSELs", Proc. SPIE, 2007, vol. 6484, DJ-1.

Martin Grabherr et al, "25Gbps and Beyond", Proc. SPIE, 2013, vol. 8639, DJ-1.

P. Moser et al, "Error-free 46 Gbit/s operation of oxide confined 980 nm VCSELs at 85° C.", Electronics Letiers Sep. 11, 2014, p. 1369, vol. 50 No. 19.

Petter Westbergh et al, "High-Speed 850 nm VCSELs with 28 GHz Modulation Bandwidth for Short Reach Communication", Elect., (2013), ett. 49, 16, 1021.

Yu-Chia Chang et al, "High Speed Tapered Oxide Apertured 980nm VCSELs Supporting Data Rates up to 30Gb/s" LEOS, Oct. 2007, p. 564.

Chinese Patent Office Action for Application No. 2017800240204 dated Nov. 20, 2019 (12 pages including English translation).

European Patent Office Extended Search Report for Application No. 17760765.2 dated Jan. 9, 2020 (9 pages).

Knodl et al., "CW room temperature operation of diode cascade INGaAs—AlGaAs quantum well VCSEL", IEEE Leos Annual Meeting Conference Proceedings: Lasers and Electro-Optics Society, vol. 1, Nov. 1999, pp. 143-144.

Knodl et al., "Multistage Bipolar Cascade Vertical-Cavity Surface-Emitting Lasers: Theory and Experiment", IEEE Journal of Selected Topics in Quantum Electronics, vol. 9, No. 5, Sep. 2003, pp. 1406-1414.

\* cited by examiner

HIGH-SPEED VCSEL DEVICE

CROSS-REFERENCE TO RELATED APPLICATION(S)

This application is a divisional of U.S. application Ser. No. 15/447,484, filed on Mar. 2, 2017, which claims the benefit of priority U.S. Application No. 62/303,632, filed on Mar. 4, 2016. The disclosure of the prior applications are incorporated herein by reference.

INTRODUCTION

There has been increasing demand for higher-speed digital communications over fiber optic links with data rates of 25 Gb/s and above. High-speed digital communications have been deployed in traditional long haul communications systems for many years. In recent years, high-speed digital communications are increasingly being used in short-haul links. These include short-haul high-speed data links for computers, high-speed Ethernet, and high-speed internet, including high-bandwidth local service to the home. There is also strong interest in these high-speed devices for short-link data transmission applications for cloud computing. These applications include data links between computers and for large server installations.

The development of higher-power higher-speed VCSEL would broaden the application of high-speed data links enabling many more applications, such as large campus configurations of distributed computing and communications.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicant's teaching in any way.

DESCRIPTION OF VARIOUS EMBODIMENTS

Figure 1:
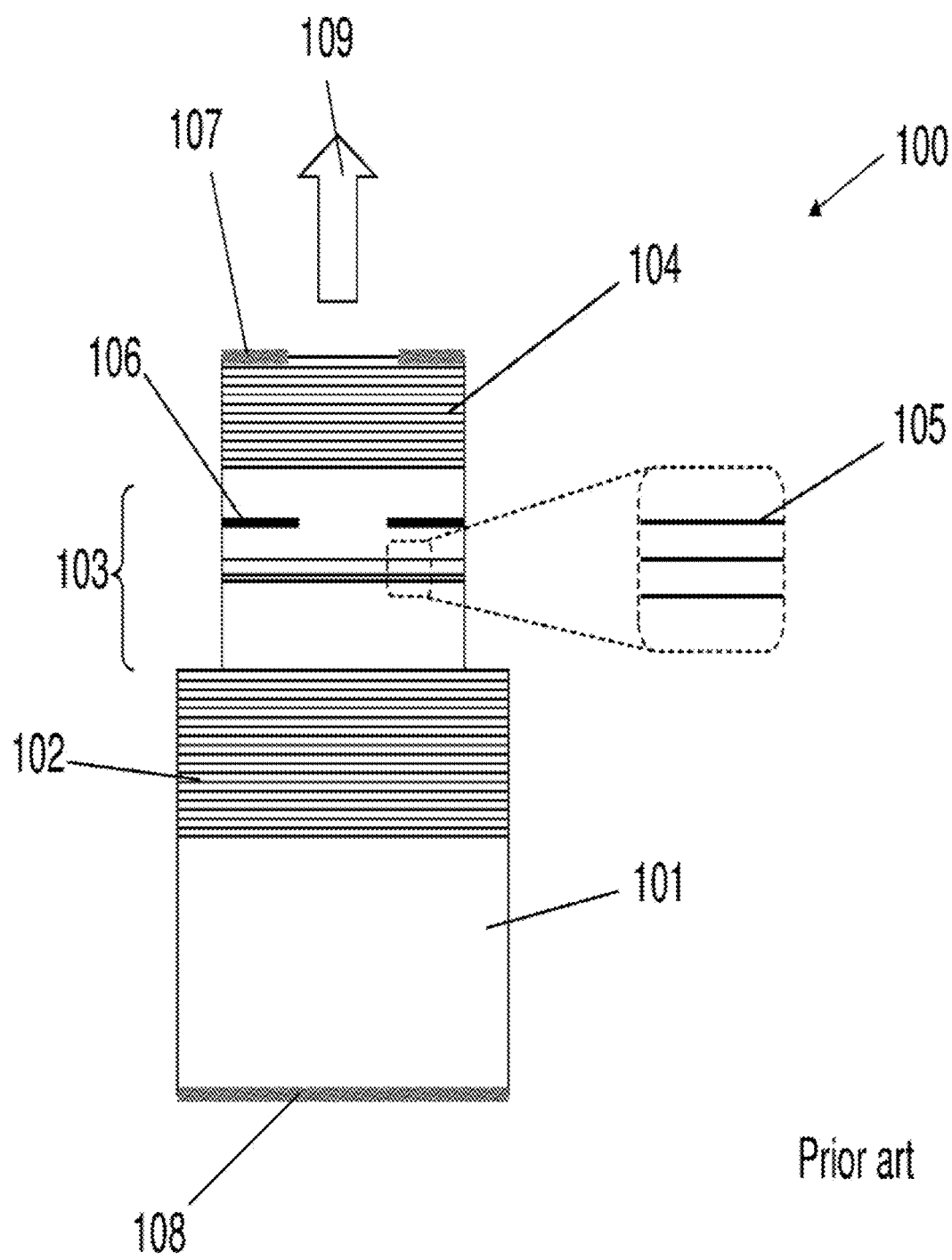
FIG. 1 illustrates a schematic diagram of a prior art top-emitting VCSEL with a single gain region comprising multiple quantum wells.

The present teaching will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the present teachings can be performed in any order and/or simultaneously as long as the teaching remains operable. Furthermore, it should be understood that the apparatus and methods of the present teachings can include any number or all of the described embodiments as long as the teaching remains operable.

Some applications for high-bandwidth optical communication and high-speed data communications utilizing VCSEL devices demand that the VCSEL devices be optimized for operation at very high speed, including bandwidths up to 40 GHz and above. The present teaching describes a high-power VCSEL device with high efficiency that can operate at very high data rates of 25 Gb/s and above. Devices according to the present teaching can generate optical output power of multiple milliWatts (mW). These powers are projected in single-mode and multi-mode optical output beams that can efficiently couple into single-mode and multi-mode optical fibers.

Prior art high-bandwidth data communications over long distances rely upon high-power CW lasers and high-speed lithium niobate modulators. Lithium niobate modulators are used because edge-emitter DFB lasers are not capable of being modulated at these high rates. They also create significant chirp of the optical wavelength and this leads to signal dispersion in the optical fiber, severely limiting transmission bandwidth. Lower-bandwidth short-reach communication is now dominated by direct modulation of VCSELs propagating over single-mode and multimode fiber links.

Recently, higher-bandwidth VCSELs have been developed that can be operated at data rates of 25 Gb/s and above. Advances in VCSEL design have reduced the series resistance and device capacitance enabling higher-bandwidth modulation. State-of-the-art VCSELs have very small cross-sections that minimize capacitance and ensure single-mode operation for coupling into single-mode optical fibers used for high-bandwidth systems. This necessarily limits the size of the gain volume with the consequence that these VCSELs have low output power being of the order of 1 mW or less.

The high-speed VCSEL devices of the present teaching overcome the low-power limitation in standard VCSELs by using a multi-stage gain region which produces higher gain and power output in the high-speed VCSEL device. Several sets of multiple quantum well gain stages may be fabricated and located in the VCSEL laser cavity. These sets of multiple quantum wells are connected to each other by means of tunnel junctions. Tunnel junctions are very highly doped p-n junctions that allow tunneling of charge carriers through the junction.

Tunnel junction technology is well known and has been used by Princeton Optronics, the assignee of the present application, and by others, for many other applications, including for high-power devices. Each tunnel junction has a capacitance, but for multiple tunnel junctions, as described by the present teaching, the capacitance is effectively in series, and thus the total capacitance is reduced by a factor equal to the number of tunnel junctions (assuming equal capacitance for each tunnel junction) thereby enabling higher speed intensity modulation.

Each gain region of a VCSEL device comprises a set of multiple quantum wells positioned at the anti-node position of a laser cavity mode to provide maximum gain and power coupling. The increased gain enables small-diameter devices to be made that can produce higher output powers. The smaller device design also reduces capacitance enabling higher speed intensity modulation. In addition, longer gain regions can be realized by connecting multiple stages of multiple quantum well gain together and the resonant cavity reduces capacitance producing a further increase in high bandwidth. Simulations show that the speed of the devices could be increased to several hundreds of GHz using this approach of dramatically reducing the device capacitance and device resistance.

One feature of the high-speed VCSEL device of the present teaching is that lower drive current is needed to generate the same or even higher output power from the VCSEL device as compared to the drive current needed to drive a prior art VCSEL device that provide a particular output power.

In addition, the high-speed VCSEL device of the present teaching has higher efficiency than prior art VCSEL devices. In particular, the high-speed VCSEL devices of the present teaching convert the same electrical input power to a much higher optical signal power than prior art VCSEL devices. This improvement in electrical-to-optical power conversion efficiency greatly simplifies the designs of the high-speed VCSEL driver electronics. This simplification substantially reduces cost for driver electronics at high frequencies, such as frequencies greater than 25 GHz. The lower-current power supplies required to drive the high-speed VCSEL devices of the present teaching will consume lower power. Thus, the entire transmitter will consume less power at lower speeds as well, for example, at speeds lower than 25 GHz.

One feature of the high-speed VCSEL devices of the present teaching is that lower current per laser aperture diameter can be realized. Requiring a low current for a given laser aperture diameter is advantageous because it will improve the reliability of the device. This is because the device reliability is limited by the current density per unit area of the device laser aperture. The current density in tunnel junction devices can be reduced by a factor of the number of tunnel junctions. As such, using multiple tunnel junctions dramatically improves the reliability of the high-speed VCSEL devices.

FIG. 1 illustrates a schematic diagram of a prior art top-emitting VCSEL 100 with a single gain region 103 comprising multiple quantum wells 105. The single gain region 103 includes a current aperture 106 to confine the activation current in the center of the gain region 103. The prior art VCSEL device illustrated in FIG. 1 comprises a substrate 101 on which is grown the VCSEL epitaxial structure, typically by MOCVD process. The VCSEL laser cavity is formed by a Distributed Bragg Grating (DBR) high-reflectivity bottom reflector 102 and a DBR partial-reflectivity top reflector 104. The DBR reflectors are effectively mirrors so they are sometimes referred to herein as mirrors. The gain section 103 is positioned in between the bottom reflector 102 and the top reflector 104. The gain section 103 contains a set of multiple quantum wells 105 plus a current aperture 106 that confines the current in the center of the VCSEL device. The VCSEL is activated by applying current through top contacts 107 and bottom contacts 108. The current aperture 106 confines the current in the center region of the VCSEL to activate the quantum wells 105 to produce optical gain and to generate a laser cavity mode in the VCSEL laser cavity. In the top-emitting VCSEL device illustrated in FIG. 1, the output beam 109 is taken out of the partial-reflectivity DBR top reflector 104.

The pulse bandwidth of a VCSEL device is controlled by the laser cavity photon lifetime, the electro-optical transitions in the quantum wells, and the electrical driving circuit, including the VCSEL electrical properties. The pulse bandwidth is sometimes referred to as the modulation bandwidth of a VCSEL device. The cavity lifetime and quantum-well transitions are very fast and so the modulation bandwidth is typically limited by the electrical properties of the driver circuit including connections to the VCSEL and the resistance and capacitance between the VCSEL electrical contacts, such as top contact 107 and bottom contact 108.

Figure 2:
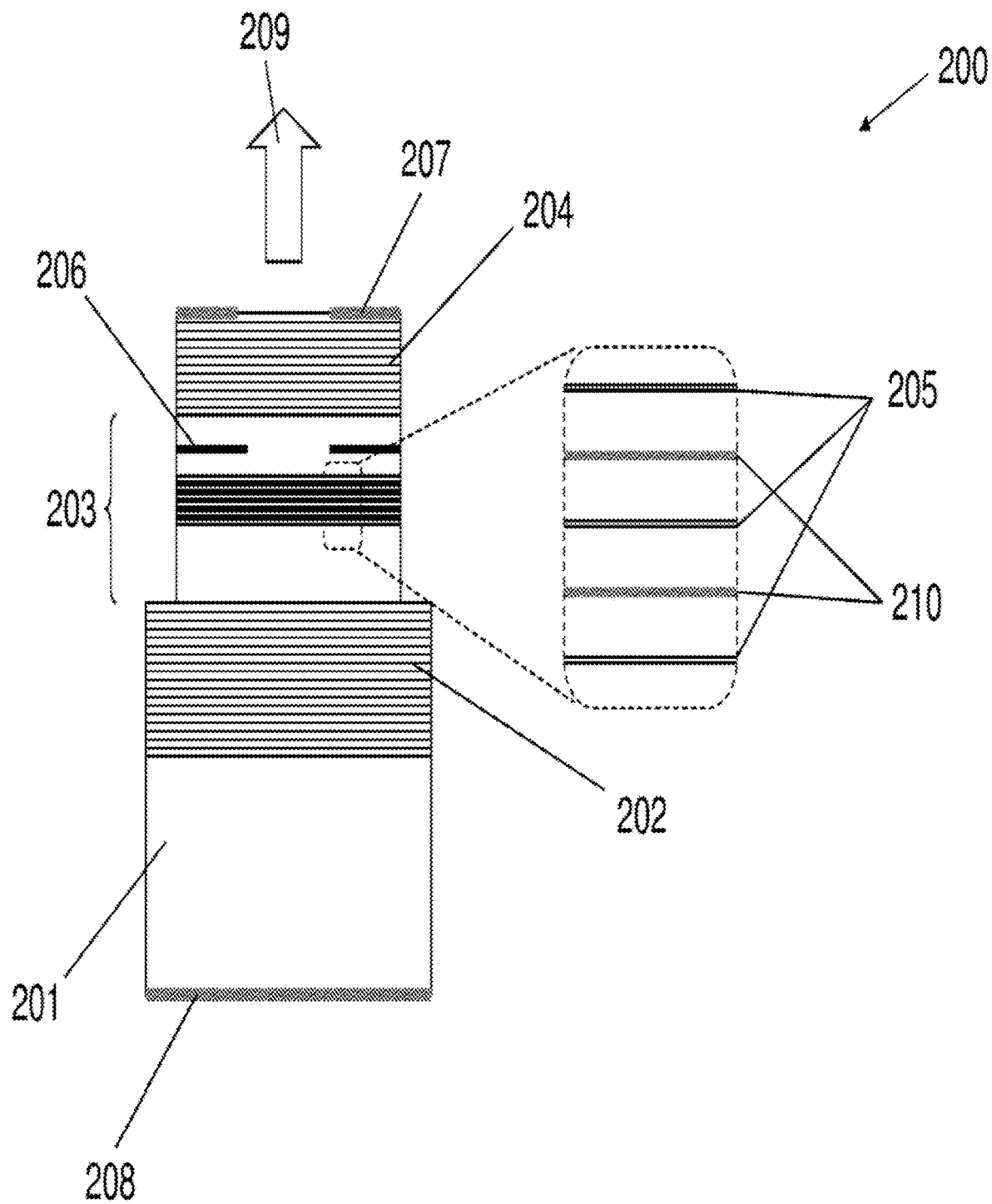
FIG. 2 illustrates a schematic diagram of an embodiment of a top-emitting high-speed VCSEL device of the present teaching utilizing multiple stages of multiple quantum wells connected to each other via tunnel junctions.

One feature of the present teaching is that the VCSEL devices are fabricated with a high-gain region that utilizes multiple stages of multiple quantum wells. FIG. 2 illustrates a schematic diagram of an embodiment of a top-emitting high-speed VCSEL device 200 of the present teaching comprising multiple stages of multiple quantum wells 205 connected to each other via tunnel junctions 210. Tunnel junctions can be used connect multiple quantum well stages in a gain region to generate high gain. Connecting multiple tunnel junctions in series reduces the total capacitance of the tunnel junction as with any other type of series connected capacitance. Thus the series connected tunnel junctions allow for high-speed modulation of the device.

The gain region 203 comprises a current aperture 206 that confines the activation current in the center of the gain region 203. The gain region 203 of the high-speed VCSEL device 200 of FIG. 2 has a geometry with a relatively long gain region length. The high-speed VCSEL device 200 comprises an epitaxial-grown layer structure on a substrate 201. The VCSEL laser cavity is formed by a DBR high-reflectivity bottom reflector 202 and a DBR partial-reflectivity top reflector 204. The bottom reflector is a DBR reflector 202 that includes multiple layers of alternating high and low refractive index material. In a top-emitting VCSEL device, the layer structure of the bottom reflector is constructed to provide high reflectivity.

The gain section 203 also has relatively high gain. The gain section 203 comprises multiple groups of quantum wells 205. In some embodiments, each group of multiple quantum wells 205 has between two to four quantum wells. Various embodiments utilize more quantum wells, depending on the specific design configuration. Each group of multiple quantum wells 205 is located at the anti-node, or position of maximum optical intensity, of the laser cavity mode. Thus, the positioning of quantum wells relative to laser cavity mode results in relatively high gain, or maximum application of gain to the laser cavity mode.

More specifically, the embodiment illustrated in FIG. 2 shows three groups of multiple quantum wells 205. Tunnel junctions 210 are positioned in between the groups of quantum wells 205. For example, the tunnel junctions 210 shown in FIG. 2 can be very thin p-n junctions that allow charge carriers to pass or tunnel through the p-n junction barrier. The tunnel junctions 210 are positioned at the nodes of the laser cavity mode to minimize any absorption effects. In the embodiment illustrated in FIG. 2, there are two tunnel junctions 210 positioned at each laser cavity mode node. Since there are three groups of multiple quantum wells 205, the gain is three times larger that that of the standard VCSEL and also the gain region 203 is three times longer. This increase in gain region length reduces the capacitance of the high-speed VCSEL device 200, thus increasing the modulation bandwidth.

The high-speed VCSEL device 200 includes one or more current apertures 206 that confine the current in the laser cavity mode region. The current apertures 206 confine current flow in the gain region. In some embodiments, the current apertures 206 are formed from a high-resistivity semiconductor layer formed by ion implantation. In some embodiments, the current apertures 206 are formed from an oxidized semiconductor layer. A second DBR mirror 204 is positioned above the gain region 203 and aperture(s) 206. The second DBR mirror 204 is partially reflecting so that it allows a portion of radiation in the laser cavity mode to exit as the output beam 209. The high-speed VCSEL device 200 is activated by applying current through the top and bottom electrical contacts 207, 208.

Some high-speed VCSEL devices according to the present teaching utilize additional groups of multiple quantum wells with tunnel junctions positioned between some or all of groups of multiple quantum wells. For example, some of these high-speed VCSEL devices utilize four groups of quantum wells with three tunnel junctions positioned in between the four groups. Extensions to additional groups of multiple quantum wells with intervening tunnel junctions will be apparent to those familiar with the art. The present teachings are not limited to how many tunnel junctions are used between groups of multiple quantum wells. In addition, the present teachings are not limited to how many groups of multiple quantum wells.

Figure 3:
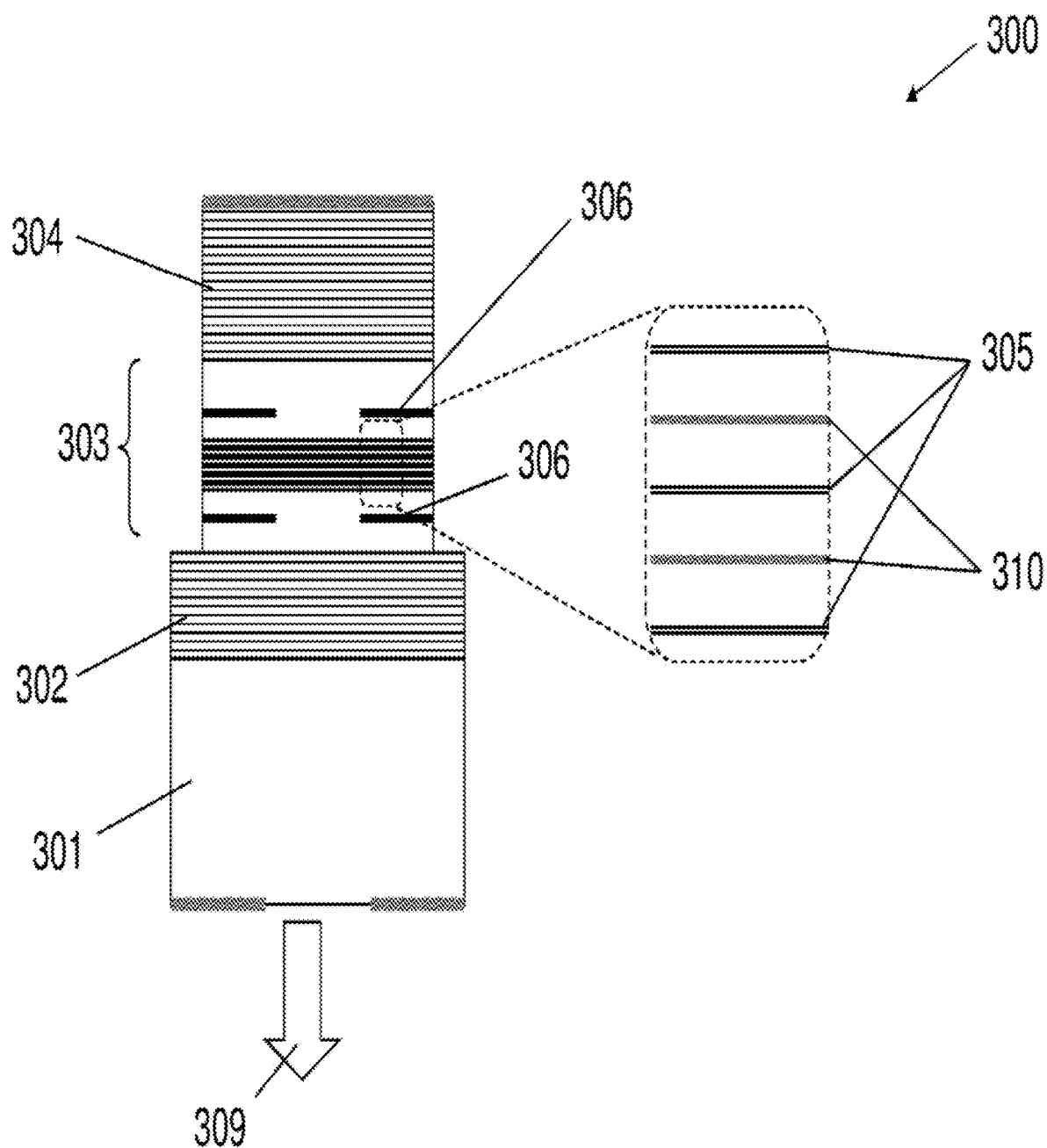
FIG. 3 illustrates a schematic diagram of an embodiment of a bottom-emitting high-speed VCSEL device of the present teaching utilizing multiple stages of quantum wells connected to each other via tunnel junctions.

FIG. 3 illustrates a schematic diagram of an embodiment of a bottom-emitting high-speed VCSEL device 300 of the present teaching utilizing multiple stages of quantum wells 305 connected to each other via tunnel junctions 310. The VCSEL configuration also includes current apertures 306 on both sides of the gain region 303 that improve current confinement. In the embodiment illustrated in FIG. 3, the VCSEL is configured as a bottom-emitting device wherein the output beam 309 emerges from the bottom DBR mirror 302 and is transmitted through the substrate 301. In this embodiment, the top DBR mirror 304 exhibits high reflectivity and the bottom DBR mirror 302 exhibits partial reflectivity. Also, in this embodiment, the gain region 306 has three groups of multiple quantum wells 305 with two intervening tunnel junctions 310. There are two current apertures 306 that confine the current. Using two apertures 306 can provide improved current flow in the longer gain region 303.

Figure 4:
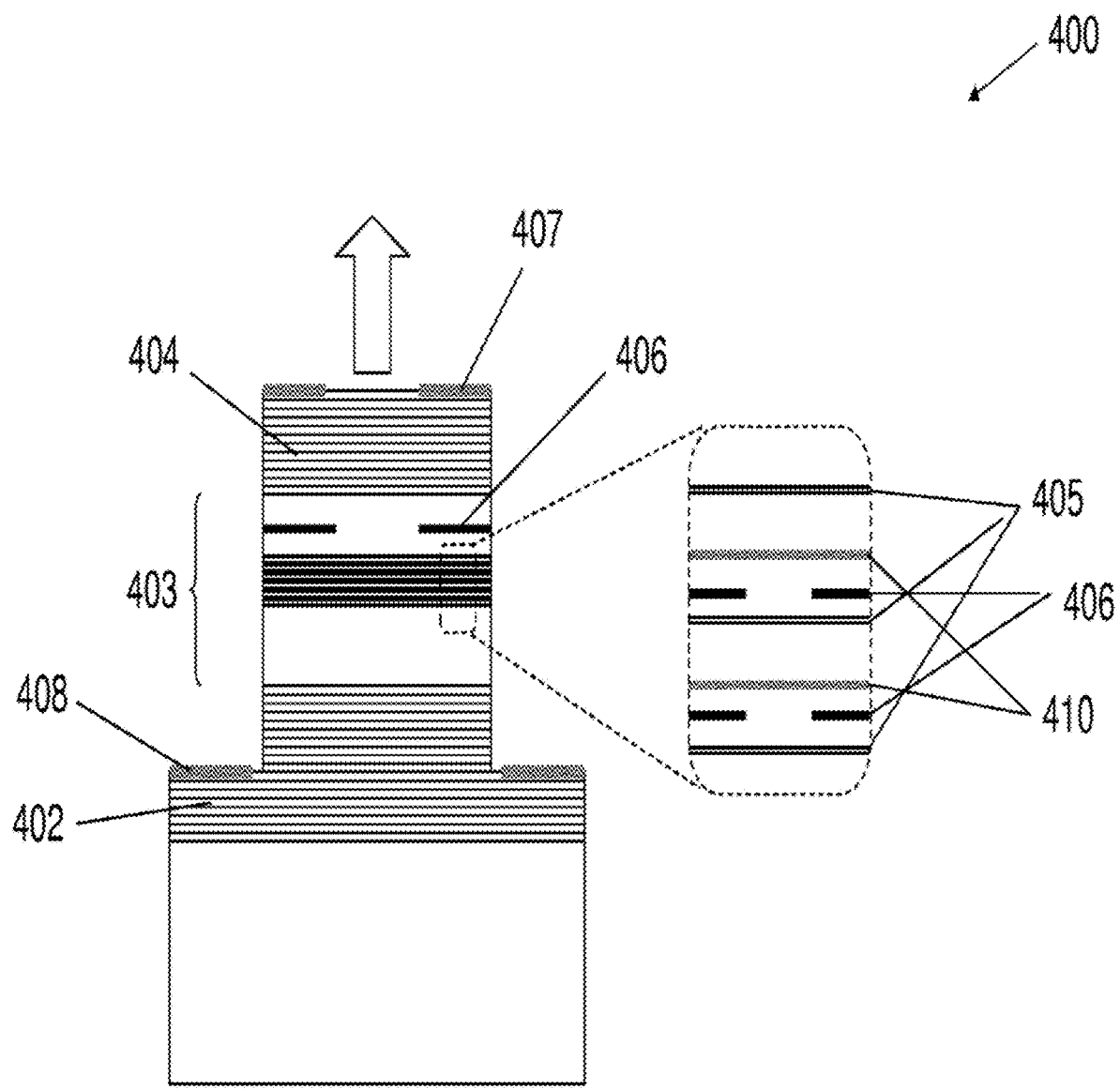
FIG. 4 illustrates a schematic diagram of an embodiment of another top-emitting high-speed VCSEL device of the present teaching utilizing multiple stages of multiple quantum wells connected to each other via tunnel junctions.

FIG. 4 illustrates a schematic diagram of another embodiment of a top-emitting high-speed VCSEL device 400 of the present teaching utilizing multiple stages of multiple quantum wells 405 connected to each other through tunnel junctions 410. The multiple stages of multiple quantum wells 405 are connected to each other using tunnel junctions 410 to form a gain region 403 that produces high gain. In the embodiment illustrated in FIG. 4, each group of multiple quantum wells 405 includes multiple current apertures 406 that confine the activation current in the center of the gain region 403.

The embodiment illustrated in FIG. 4 is a configuration that provides additional current confinement in the gain region. The use of multiple current apertures 406 confine current in the high-gain region 403 that comprises multiple quantum wells 405. The current apertures 406 are located above each group of multiple quantum wells 405. Two of the current apertures 406 are located below the respective tunnel junctions 410. Also, the embodiment illustrated in FIG. 4 comprises a VCSEL layout with an alternative arrangement for the bottom contact 408. In this configuration, a mesa is partially etched into the bottom DBR mirror 402. This configuration for the bottom contact 408 has two important features. First, it places both electrical contacts 407, 408 on the same side of the high-speed VCSEL device 400. Second, the current is injected into the center region of the DBR mirror 402 improving efficiency.

A major source of high electrical resistance in VCSEL devices is the many layers of DBR mirror 402. A bottom contact 408 is positioned on a mesa that is partially etched into the DBR mirror. The bottom contact 408 injects current so that it only flows through a subset of the DBR layers, thus resulting in a lower electrical resistance path through the device. Achieving a relatively low electrical resistance path through the VCSEL is necessary to achieve high-frequency modulation or high modulation bandwidth operation. In one embodiment, the packaging is configured so that high-speed electrical connections are provided to the VCSEL with both the top and bottom contacts positioned in close proximity and accessible on the same side of the device.

Figure 5:
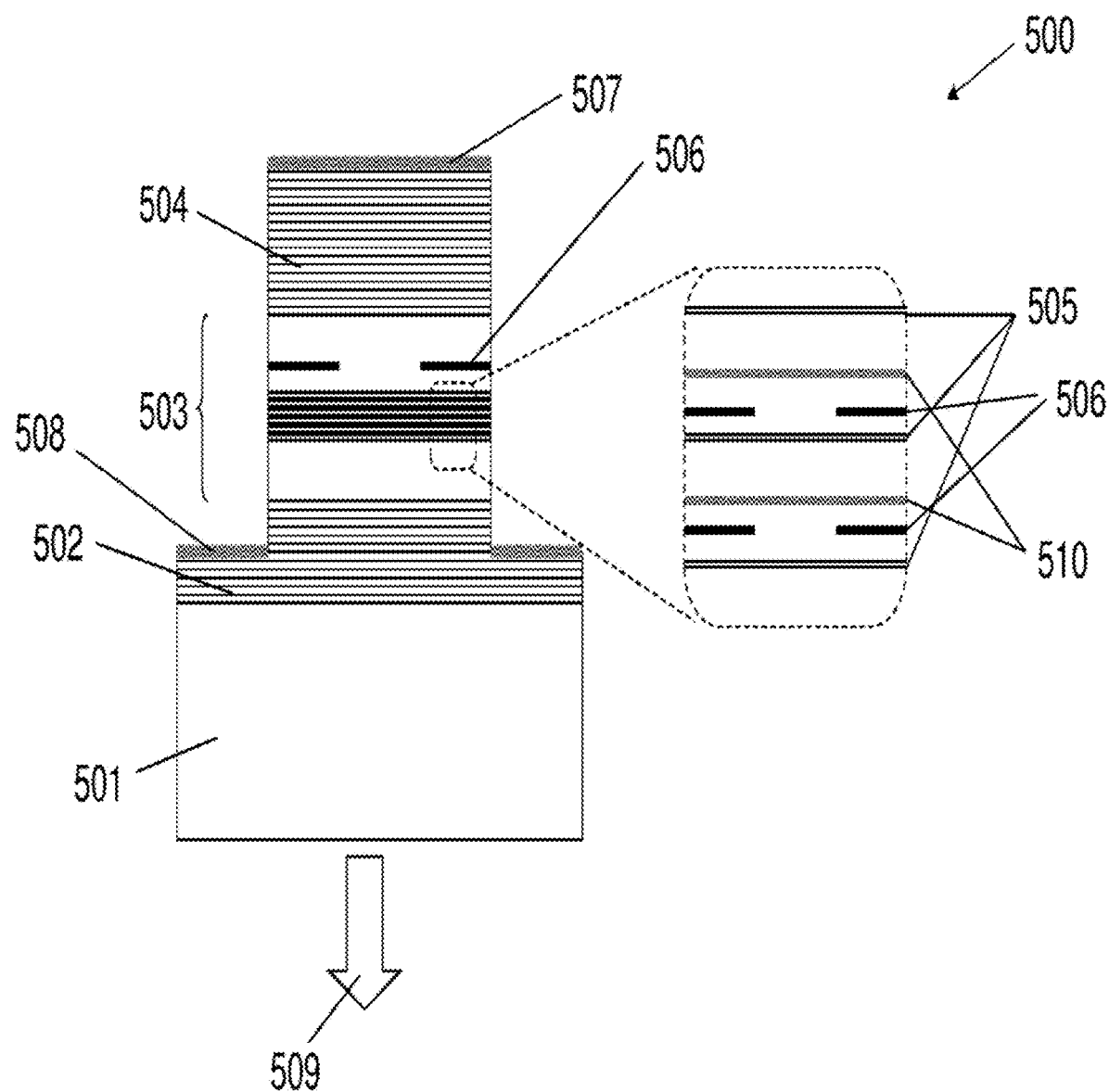
FIG. 5 illustrates a schematic diagram of an embodiment of another bottom-emitting high-speed VCSEL device of the present teaching utilizing multiple stages of multiple quantum wells connected to each other via tunnel junctions.

FIG. 5 illustrates a schematic diagram of another embodiment of a bottom-emitting high-speed VCSEL device 500 of the present teaching utilizing multiple stages of multiple quantum wells 505 connected to each other using tunnel junctions 510. In this embodiment, each group of multiple quantum wells 505 includes a current aperture 506 that confines the activation current to the center of the gain region. The bottom-emitting high-speed VCSEL device 500 layout of FIG. 5 is similar to the top-emitting VCSEL described in FIG. 4 in that both the top and bottom contacts are accessible from the same side of the device. The top DBR mirror 504 exhibits high reflectivity. The output beam 509 passes through the substrate 501 and emerges through the bottom partially reflecting DBR mirror 502. In this embodiment, the gain section 503 has three groups of multiple quantum wells 505 with associated current apertures 506. Two tunnel junctions 510 are positioned in between the stages of multiple quantum wells 505. The top contact 507 is positioned on the top DBR mirror 504 and the bottom contact 508 is positioned on the same side of the device on a partially etched bottom DBR mirror 502.

Figure 6:
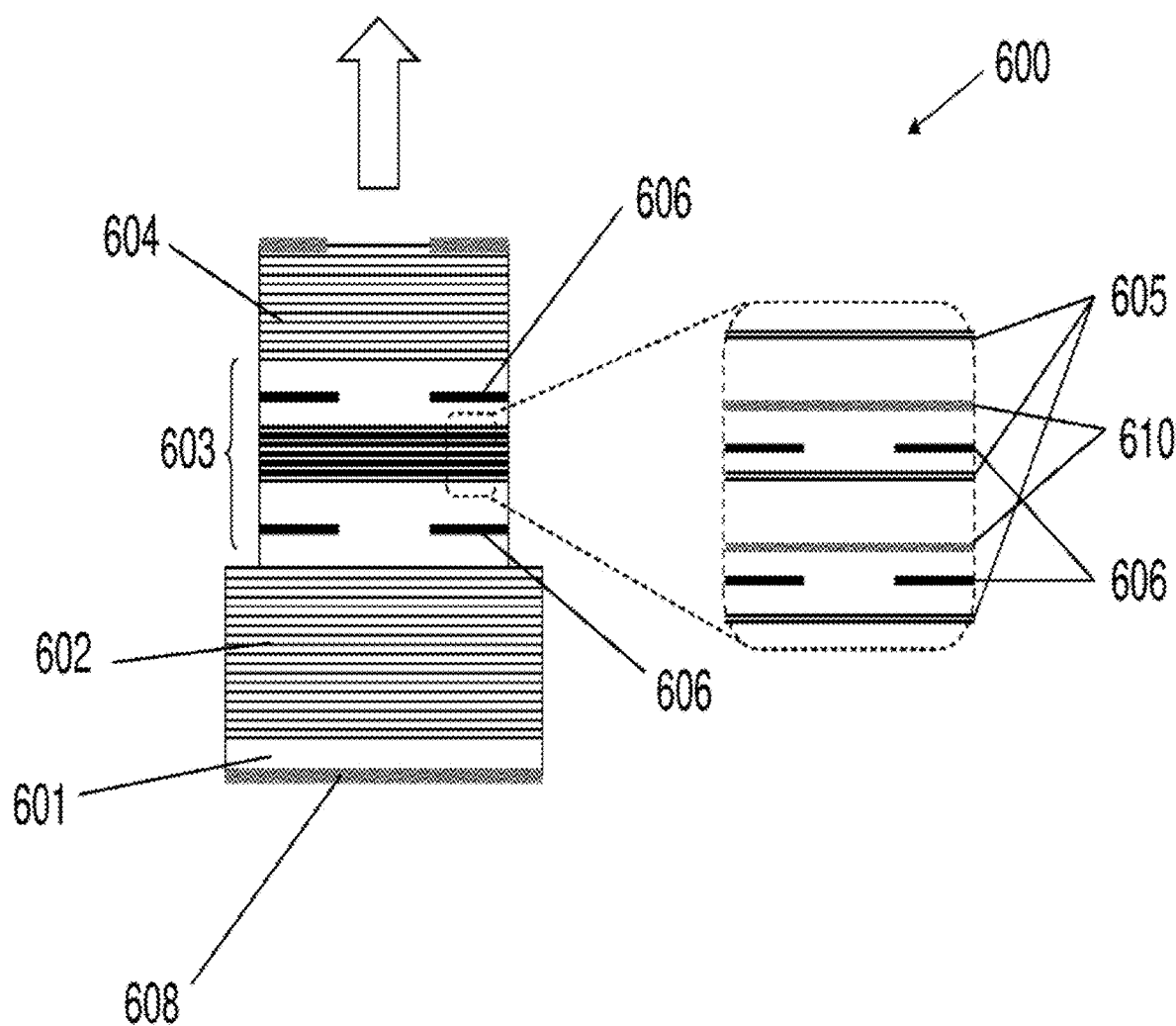
FIG. 6 illustrates a schematic diagram of an embodiment of another top-emitting high-speed VCSEL device of the present teaching utilizing multiple stages of multiple quantum wells connected to each other via tunnel junctions.

FIG. 6 illustrates another embodiment of a top-emitting high-speed VCSEL device 600 of the present teaching utilizing multiple stages of multiple quantum wells 605 connected to each other through tunnel junctions 610. In the embodiment illustrated in FIG. 6, each group of multiple quantum wells 605 includes a current aperture 606 that confines the activation current in the center of the gain region. There is a current aperture 606 below the last group of multiple quantum wells 605 and a current aperture 606 between the last group of multiple quantum wells and the DBR mirror 602.

FIG. 6 illustrates two additional features of a high-speed VCSEL device that are desirable for shorter-wavelength and/or high-power operation. First, the gain region 603 has current apertures 606 between both top and bottom DBR mirrors 604, 602 as well as between the groups of multiple quantum wells 605. Positioning current apertures near both the top and bottom DBR mirrors provides further confinement of the current in the gain section to maximize the gain and power conversion from the injected current to the optical mode. Second, the substrate 601 thickness has been reduced, and in some embodiments, is completely removed, to improve thermal performance. Thinning or removing the substrate 601 improves the heat transfer from the gain region 603 to a heat spreader and heat sink (not shown) which are typically bonded to the bottom contact 608 with a thermally conducting bonding agent.

While high-speed VCSEL devices of the present teaching can be multimode or single mode output, the polarization of a single mode output beam from a VCSEL is typically linear. However, the orientation of the polarization is not well defined in VCSEL devices and can vary under different operating conditions. It can be important for some applications that utilize high-speed VCSEL devices according to the present teaching that the optical output power from the VCSEL be linearly polarized and that the direction of polarization be pre-defined. There are several techniques for obtaining linear polarization with a pre-defined direction from a VCSEL device. One common method is to use a non-symmetrical laser aperture such as elliptical shape or rectangular shape. Another method is to use a reflector in the resonant cavity that preferentially reflects the desired polarization.

One feature of the present teaching is the use of sub-wavelength gratings to increase the speed of the devices. In some embodiments, sub-wavelength gratings replace the distributed Bragg reflector (DBR) mirrors used in prior art VCSELs. In some embodiments, both DBR mirrors and sub-wavelength gratings are used in order to reduce the number of DBR layer pairs in the VCSEL devices. Reducing the number of DBR layer pairs, or completely eliminating the DBR mirrors, by using sub-wavelength gratings, reduces the device resistance and thereby reduces the RC time constant and increases the speed of the devices. Simulations were performed to verify that the combination of positioning tunnel junction between gain regions as described herein and eliminating DBR mirrors by using sub-wavelength gratings as described herein results in VCSEL devices that can deliver bandwidth greater than 1 THz, and high-speed data rates in excess of 1 Tb/s. However, one skilled in the art will appreciate that VCSEL devices that include the tunnel junctions and/or sub-wavelength gratings described herein have many desirable features. For example, utilizing the sub-wavelength gratings described herein provides efficient coupling of the VCSEL output to integrated optics waveguides that are not necessary high-speed/high bandwidth devices.

Figure 7:
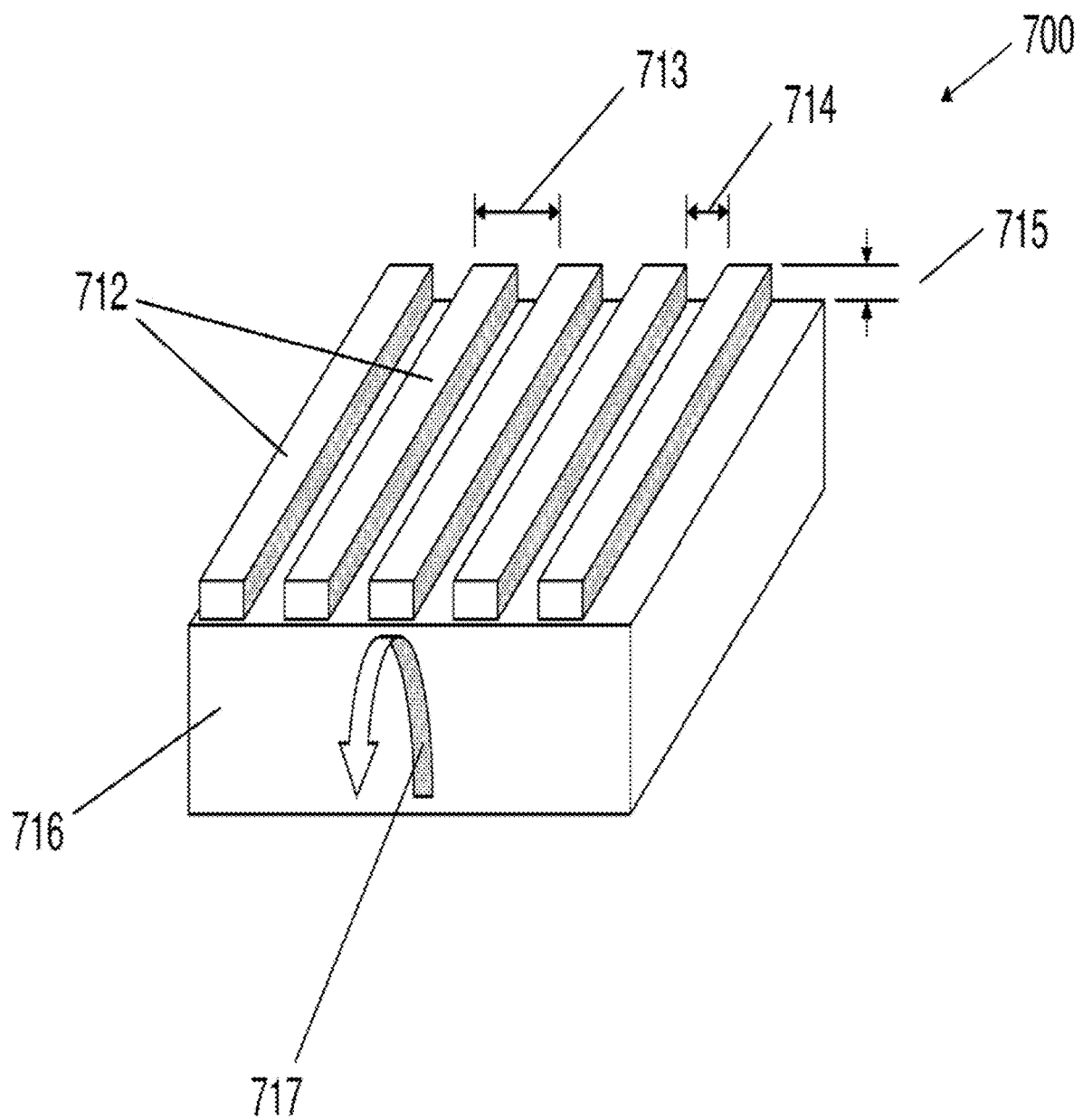
FIG. 7 illustrates a schematic diagram of an embodiment of a sub-wavelength grating reflector according to the present teaching.

FIG. 7 illustrates an embodiment of a sub-wavelength grating reflector 700 according to the present teaching. The sub-wavelength grating reflector 700 is a narrow-band wavelength reflector. A sub-wavelength grating comprising stripes 712 with a period 713 that are positioned on a substrate 716. The substrate may be a transparent substrate. The sub-wavelength grating 712 is polarization selective and reflects a narrow wavelength band. Consequently, the sub-wavelength grating reflector 700 is highly reflective for one particular direction of linear polarization. The period 713 of the sub-wavelength grating 712 is smaller than the length of the wavelength of the laser light that is reflected by the sub-wavelength grating 712. This configuration results in a diffraction angle that is greater than 90 degrees where the diffracted beam is parallel to the grating surface and produces coupling between the diffracted light and various types of modes along the grating structure.

The grating stripes 712 have a spacing 714 and height 715. Under various configurations of the spacing 714 and height 715 of the stripes 712, the coupling between the diffracted light and various types of modes along the grating structure results in direct normal reflection of the light 717 which varies with wavelength and polarization. Thus, light of a specific wavelength and polarization incident from a direction normal to the plane defined by the multiple stripes 712 is reflected back along the direction normal to the plane defined by the multiple stripes 712. The polarization may be a linear polarization with a particular orientation. The grating stripes 712 typically comprise one or more layer structures with different refractive index deposited on substrate 716, which may be a transparent substrate.

Figures 8A, 8B:
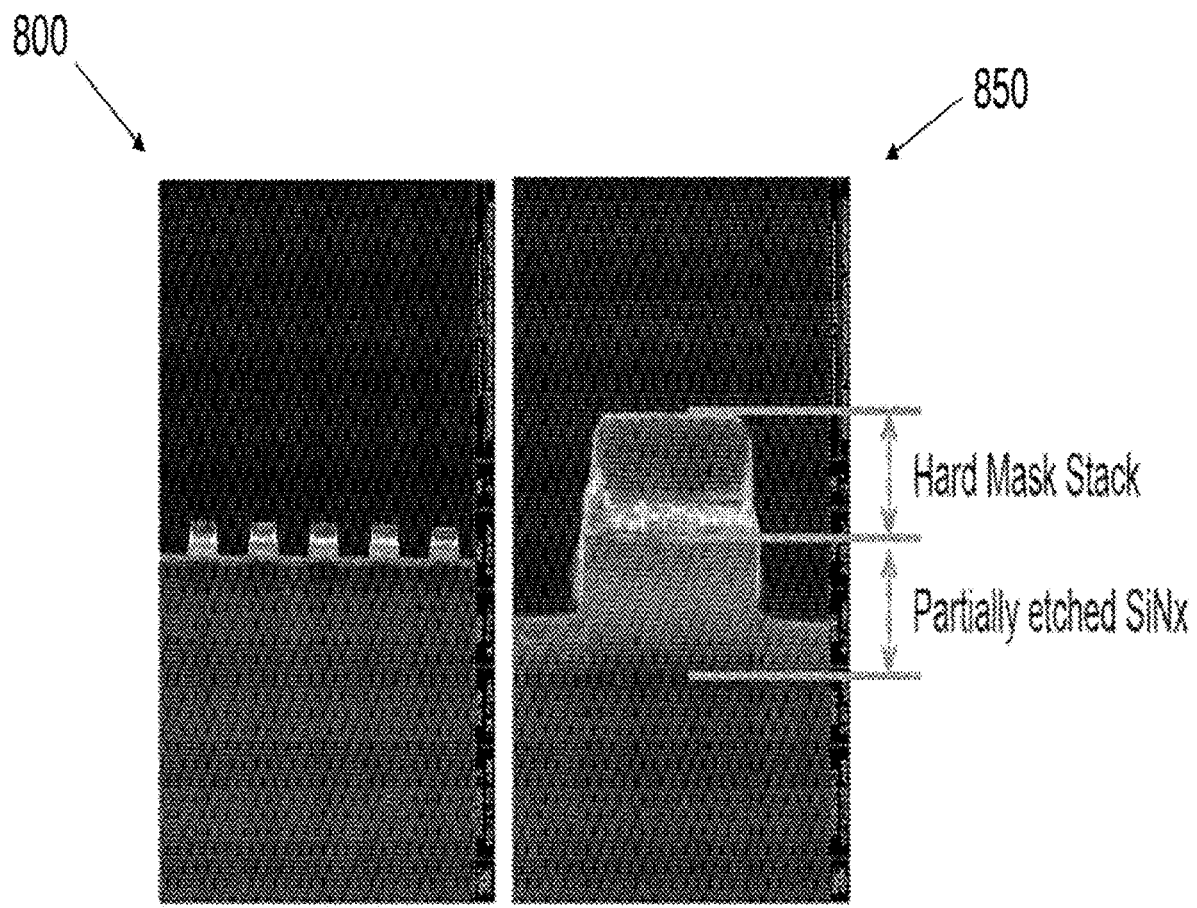
FIG. 8A presents a scanning electron microscope (SEM) picture showing the side-view of a section of an embodiment of a sub-wavelength grating reflector according to the present teaching.
FIG. 8B presents an SEM picture close-up cross section of one stripe of the sub-wavelength grating reflector embodiment of FIG. 8A.

FIG. 8A presents a scanning electron microscope (SEM) picture 800 showing the side-view of a section of an embodiment of a sub-wavelength grating reflector according to the present teaching. FIG. 8A shows five periods of the grating structure on a transparent substrate. FIG. 8B presents a SEM picture 850 close-up cross section of one stripe of the sub-wavelength grating reflector embodiment of FIG. 8A.

The close-up SEM picture presented in FIG. 8B shows the grating stripe, which, in this embodiment, is made up of two layers of different materials.

Figures 9A, 9B:
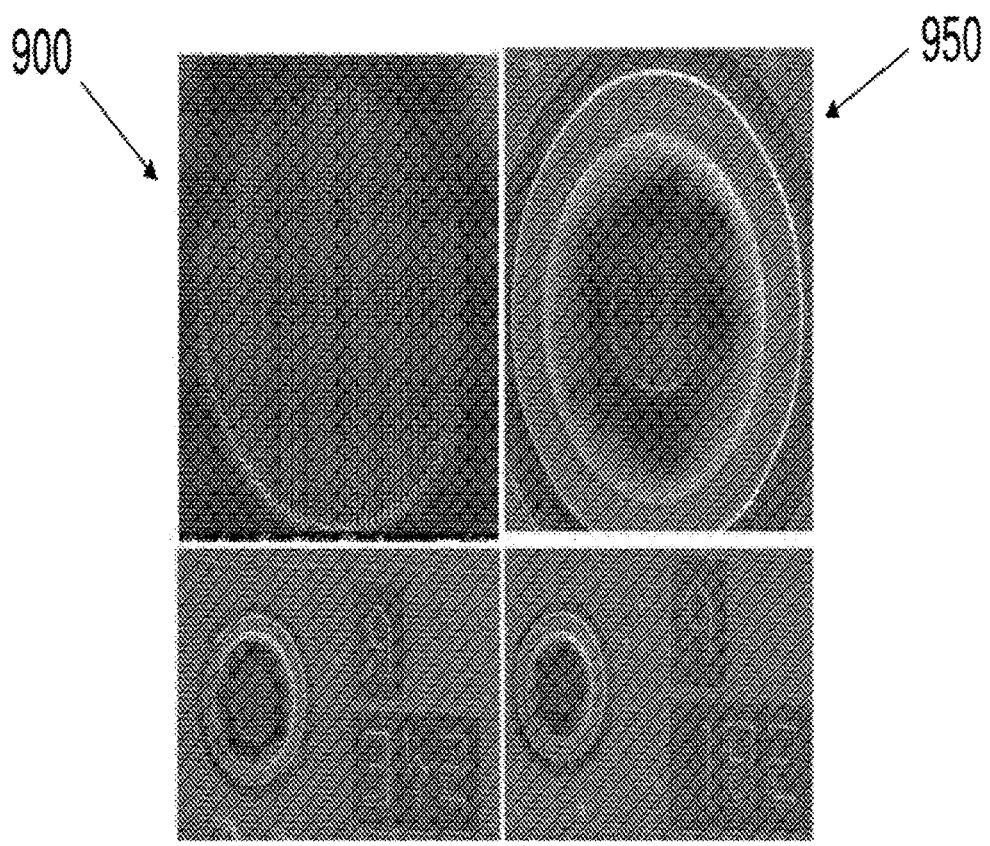
FIGS. 9A and B presents SEM pictures of top views of embodiments of high-speed VCSEL devices with sub-wavelength gratings of the present teaching with different magnifications.

FIGS. 9A and 9B present SEM pictures 900, 950 of top views of embodiments of high-speed VCSEL devices with sub-wavelength gratings of the present teaching with different magnifications. Also, shown below each SEM picture are lower magnification photos used to reference the particular VCSEL device featured in the SEM picture. The sub-wavelength gratings are fabricated as the top reflector for the high-speed VCSEL device. FIG. 9A presents an SEM picture 900 at relatively high magnification so that it clearly shows the grating structure in the circular laser aperture of the high-speed VCSEL device. FIG. 9B presents an SEM picture 950 with lower magnification for comparison.

Figure 10:
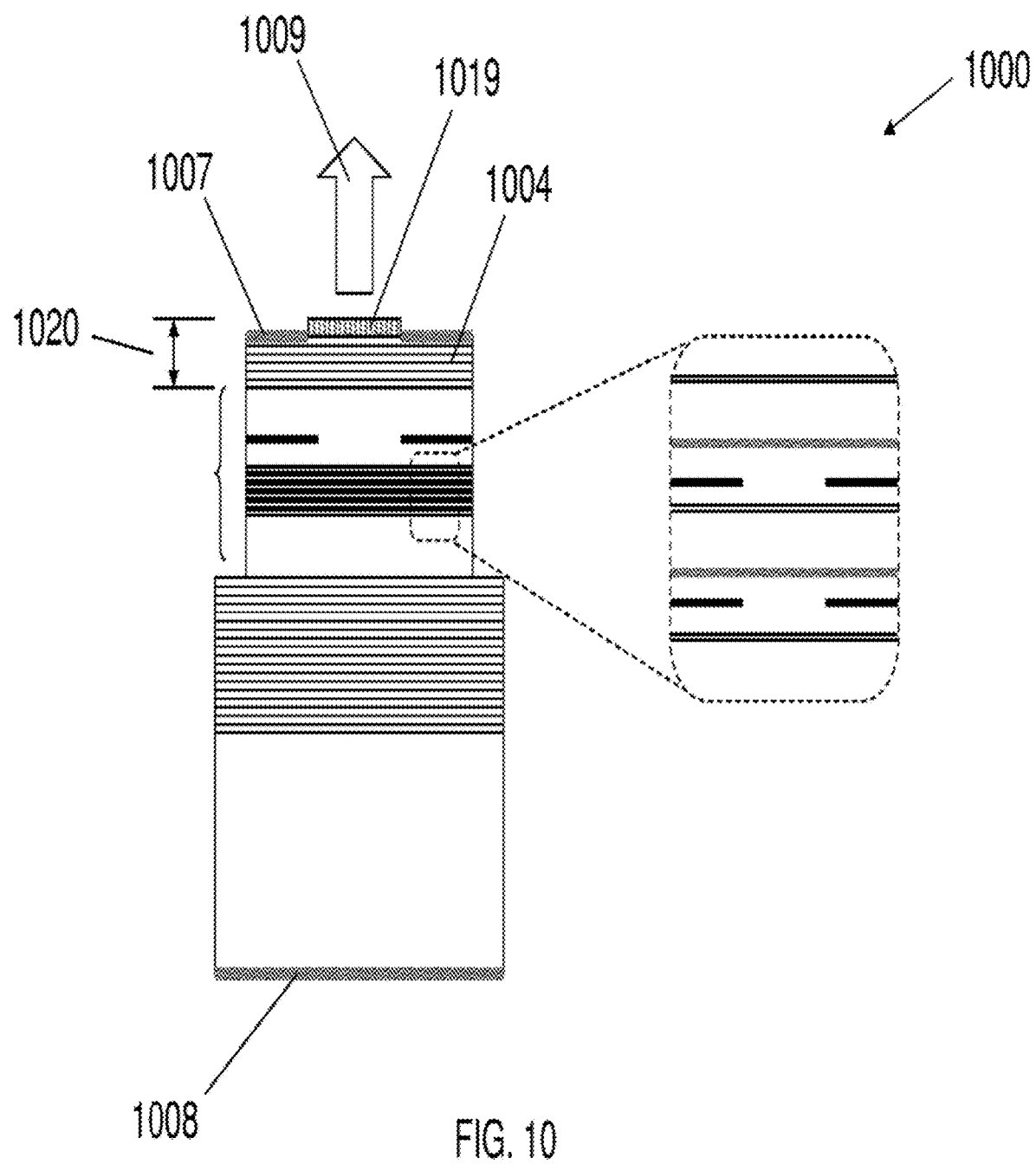
FIG. 10 illustrates a schematic diagram of a laser structure of an embodiment of a high-speed VCSEL device according to the present teaching.

FIG. 10 illustrates a schematic diagram of a laser structure of an embodiment of a high-speed VCSEL device 1000 according to the present teaching. The laser structure illustrated in FIG. 10 includes a sub-wavelength grating 1019 combined with a DBR mirror 1004 acting as a top reflector. This laser structure is similar to the VCSEL that is shown in the SEM pictures in FIGS. 9A and 9B. One feature of combining the sub-wavelength grating 1019 and the DBR mirror 1004 in the same structure is that such a structure has the efficiency of a DBR mirror device with the polarization selectivity of the sub-wavelength grating device. The DBR mirror 1004 has a thickness that is thinner than required if there were no sub-wavelength grating, and has fewer layer pair periods giving it lower reflectivity. The sub-wavelength grating 1019 is fabricated on top of the DBR mirror 1004. The combined reflectivity a sub-wavelength grating 1019 and DBR mirror 1004 is made to equal the partial reflectivity of a design for a top-emitting VCSEL DBR mirror without a sub-wavelength grating. The thickness 1020 of the top mirror, which includes both a DBR mirror 1004 and a sub-wavelength grating 1019, is much thinner than a DBR mirror structure with an equivalent reflectivity DBR mirror without a sub-wavelength grating. Consequently, the high-speed VCSEL device 1000 will lase with the same power as a design using a top-emitting VCSEL DBR mirror structure with more layers and without the sub-wavelength grating.

The resulting high-speed VCSEL device 1000 will have a relatively high-speed response with a linear polarized output beam 1009 with the polarization orientation defined by the stripe pattern and the dimensions of the sub-wavelength grating 1019. The smaller thickness 1020 of the top mirror that combines the sub-wavelength grating 1019 and the DBR mirror 1004 will result in lower electrical resistance between the electrical contacts 1007, 1008. The lower electrical resistance results in a higher-speed response due to the lower RC time constant. In other embodiments, the DBR mirrors are completely replaced by the sub-wavelength grating, which further reduces the resistance of the device.

Figure 11:
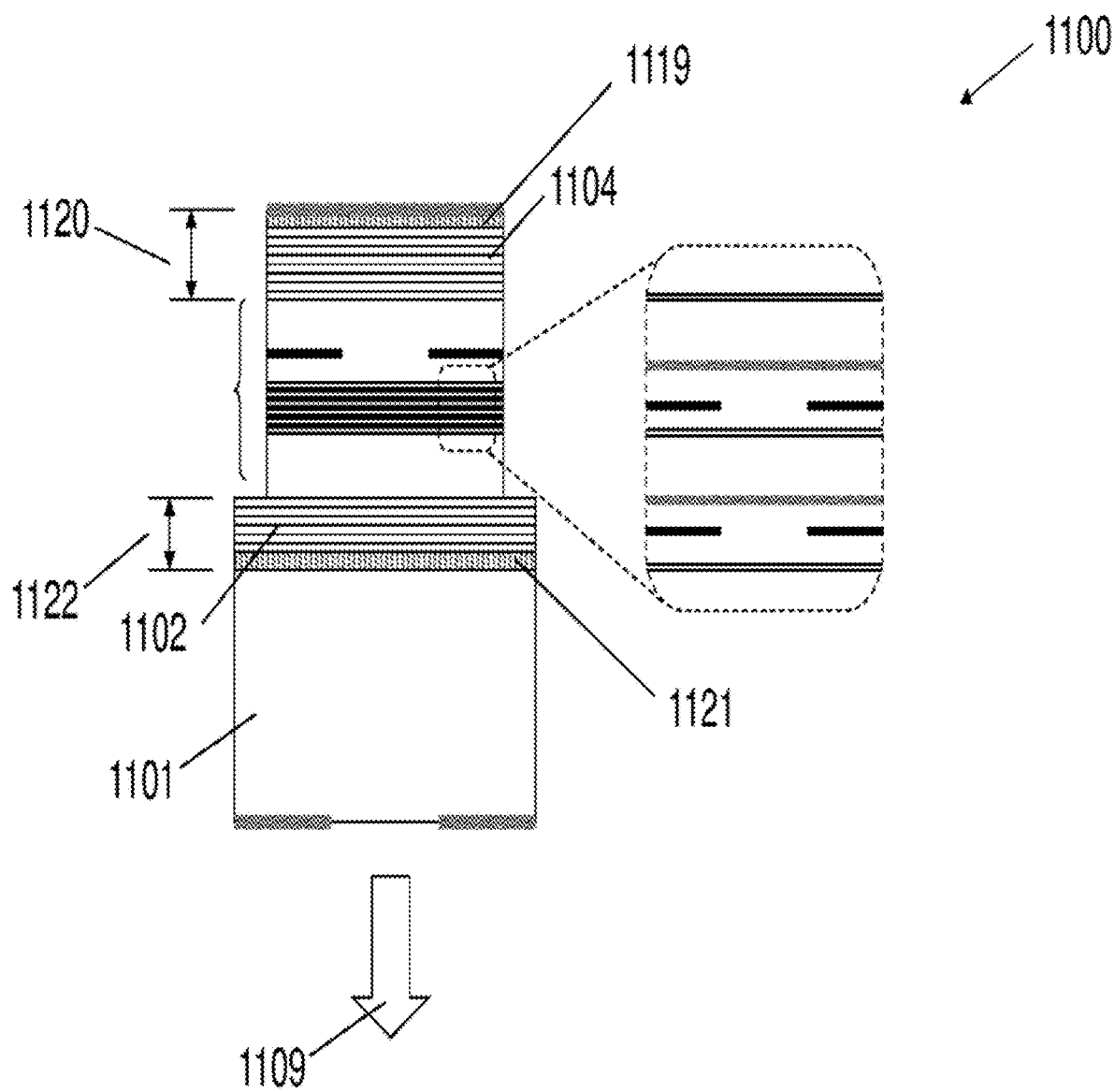
FIG. 11 illustrates a schematic diagram of a laser structure of another embodiment of a high-speed VCSEL device according to the present teaching.

FIG. 11 illustrates a schematic diagram of a laser structure of another embodiment of a high-speed VCSEL device 1100 according to the present teaching. In this embodiment, sub-wavelength grating 1119 is combined with DBR gratings 1104 to form a top reflector and sub-wavelength grating 1121 is combined with DBR gratings 1102 to form a bottom reflector of a bottom-emitting multi-stage-gain high-speed VCSEL. The top reflector is designed to be highly reflective. The thickness 1120 of the top reflector is less than a thickness that would be required if no sub-wavelength grating was incorporated into the structure. The bottom reflector is designed to have the requisite partial reflection coefficient to allow for light to be emitted from the bottom of the device through the substrate 1101. The thickness 1122 of the bottom reflector is smaller than if no sub-wavelength grating were used. The two gratings 1119, 1121 are aligned to produce the same linear polarization orientation for the laser output beam 1109. The resulting linear polarized laser output beam 1109 is transmitted through the substrate 1101.

The high-speed VCSEL device 1100 has an electrical resistance that is lower than an electrical resistance that can be obtained with similar laser strictures without the sub-wavelength gratings. Low electrical resistance is achieved because both the DBR gratings 1104, 1102 are reduced in thickness because they are combined with sub-wavelength gratings and thus require a fewer number of layers. The relatively low resistance of the high-speed VCSEL device 1100 enables higher-speed operation. In other embodiments, the top and bottom reflectors are completely replaced by the sub-wavelength gratings, producing even further reduction in the device resistance.

In many embodiments, the sub-wavelength grating is much thinner than the DBR mirror since the sub-wavelength grating may comprises only one or two layers of epitaxial material and there are typically many epitaxial layers in a DBR mirror structure. The fact that a sub-wavelength grating produces similar reflectivity using fewer material layers can offer several advantages in producing low profile devices and near-planar devices for flip-chip or surface mounting processes.

Figure 12:
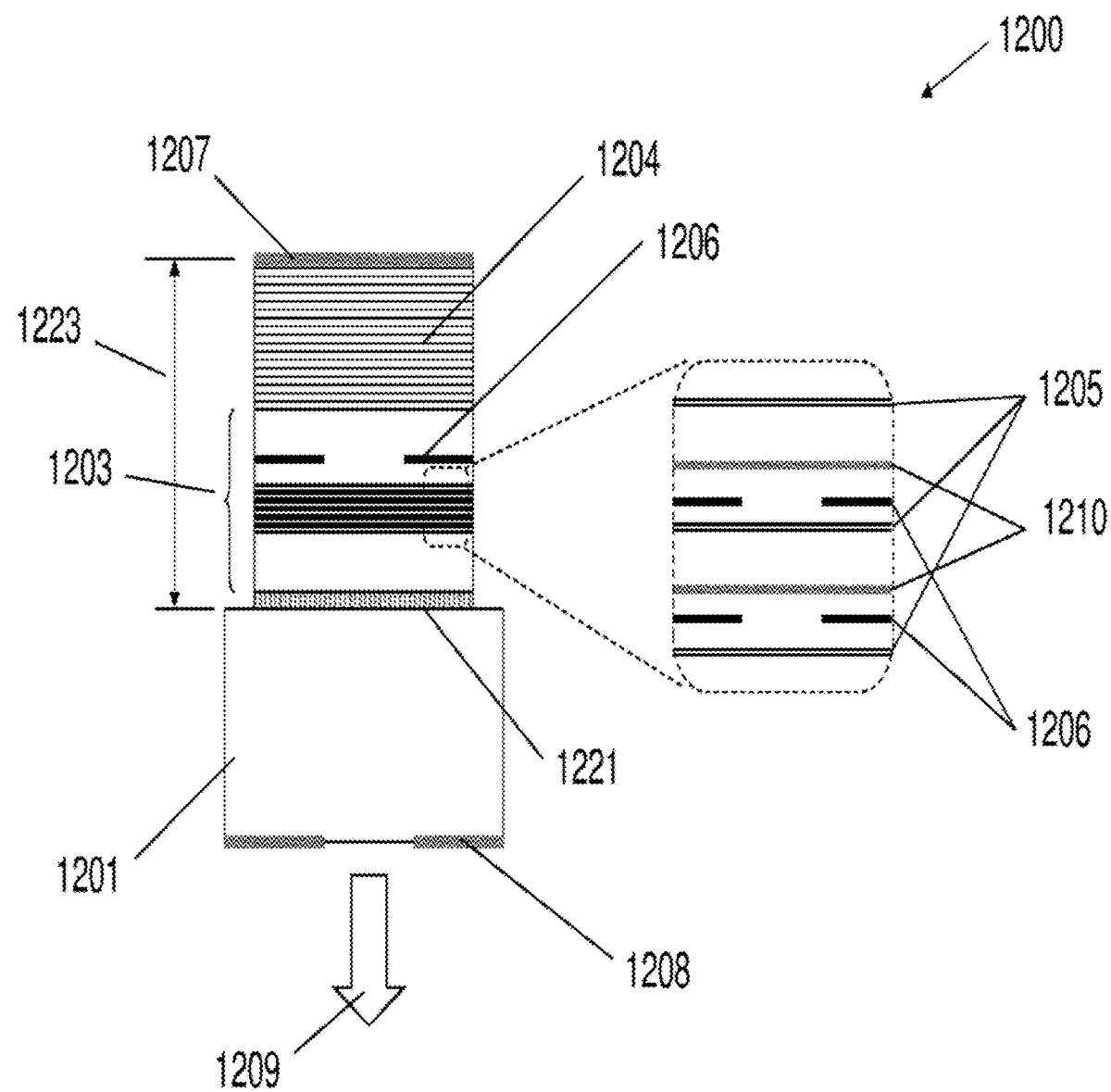
FIG. 12 illustrates a schematic diagram of an embodiment of a bottom-emitting multi-gain-stage high-speed VCSEL device according to the present teaching.

FIG. 12 illustrates a schematic diagram of an embodiment of a bottom-emitting multi-gain-stage high-speed VCSEL device 1200. In the embodiment shown in FIG. 12, the sub-wavelength grating 1221 functions as the bottom reflector and a DBR reflector 1204 is used for the top reflector. The laser cavity is formed by the top DBR reflector 1204 and the sub-wavelength grating 1221. The laser cavity and the gain region 1203 produce a linearly polarized output beam 1209 when activated by a current applied to contacts 1207, 1208. In this embodiment, the output beam 1209 emerges from the transparent substrate 1201. The gain region 1203 comprises multiple current apertures 1206 and multiple stages of multiple quantum wells 1205 that are connected using tunnel junctions 1210. Current apertures 1206 are also positioned in between the multiple stages of multiple quantum wells 1205. The thickness 1223 from the top mirror to the bottom mirror of the bottom-emitting multi-gain-stage high-speed VCSEL device 1200 is less than if the bottom mirror utilized a DBR reflector. Thus, the multi-gain-stage high-speed VCSEL device 1200 also has reduced device resistance allowing the device to exhibit a higher modulation bandwidth.

Figure 13:
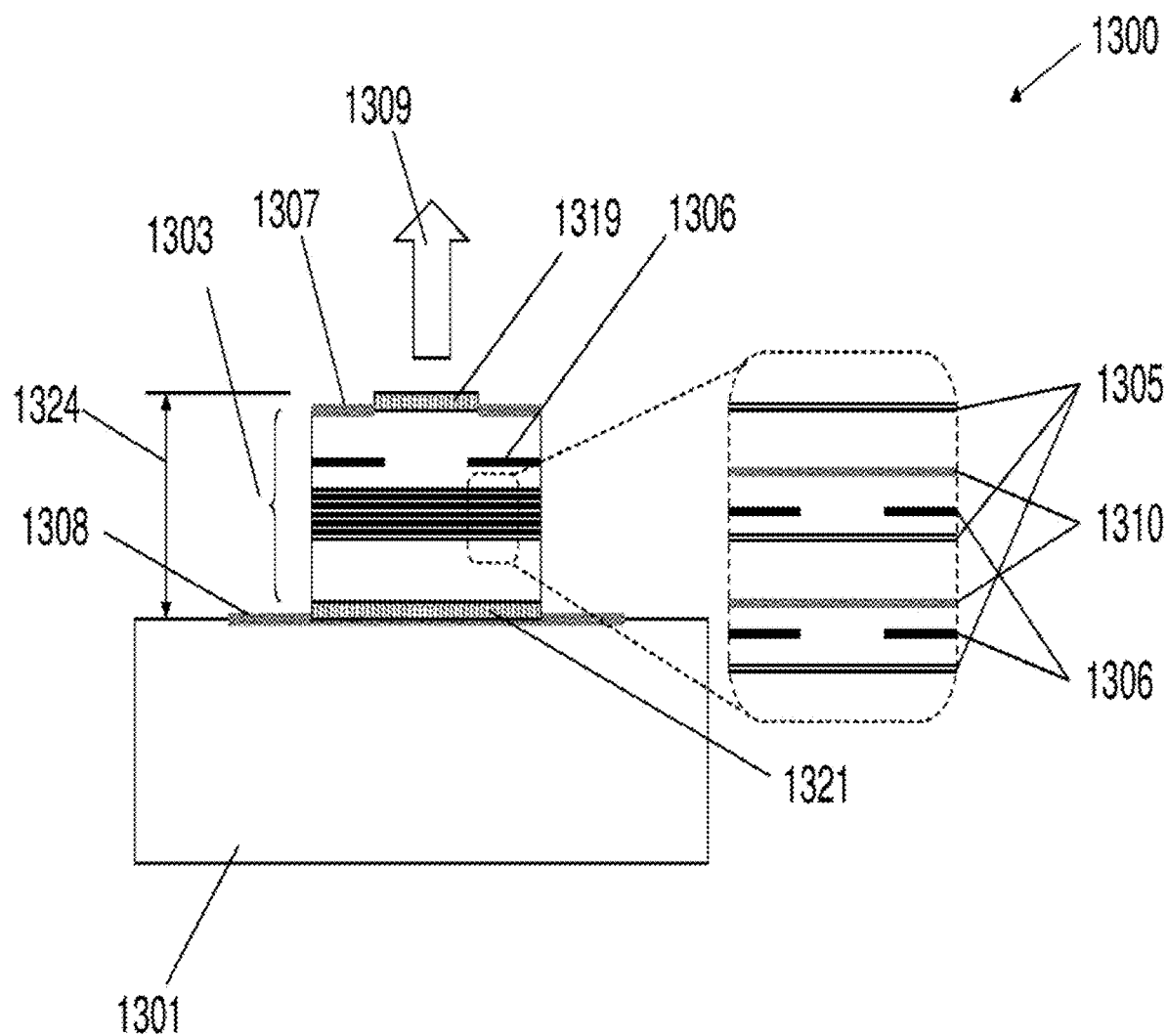
FIG. 13 illustrates a schematic diagram of an embodiment of a top-emitting high-speed VCSEL device with sub-wavelength grating mirrors according to the present teaching.

FIG. 13 illustrates a schematic diagram of an embodiment of a top-emitting high-speed VCSEL device 1300 with sub-wavelength grating mirrors according to the present teaching. In this embodiment, the bottom high-reflecting DBR mirror is replaced with a high-reflecting sub-wavelength grating 1321 fabricated on the substrate 1301. An epitaxial structure forming a gain section 1303 is positioned on top of the sub-wavelength grating 1321. The epitaxial structure has more than one group of multiple quantum wells 1305, tunnel junctions 1310 and current apertures 1306. A partial reflecting top sub-wavelength grating reflector 1319 is positioned on top of the gain section 1303. The partial reflecting top sub-wavelength grating reflector 1319 has its linear polarization aligned to that of the bottom grating 1321. In this embodiment, the sub-wavelength gratings 1321, 1319 are much thinner than the DBR mirrors used in known VCSELs. Thus, the VCSEL device 1300 thickness 1324, measured as the distance between the contacts 1308, 1307, is much thinner since the top reflector is the sub-wavelength grating 1319 and the bottom reflector is the sub-wavelength grating 1321. This is because the sub-wavelength gratings 1319, 1321 require many fewer epitaxial layers than an equivalent reflectivity DBR mirror.

The spacing 1324 between the top and bottom grating reflectors is configured so that the laser cavity wavelength corresponds to the gain-region wavelength and also so that the laser resonant cavity antinodes are located at the multiple quantum wells 1305 and the nodes are located at the tunnel junctions 1310. The bottom contact 1308 is located on the top of the substrate 1301 so that both contacts 1307, 1308 are on the same side of the high-speed VCSEL device 1300.

Embodiments that use sub-wavelength gratings to eliminate the need for DBR mirrors for both the top and bottom cavity reflector produce the lowest height profile high-speed VCSEL device 1300. The low height profile results in lower electrical resistance between contacts 1307, 1308 and thus allows for higher-speed/higher bandwidth operation. This means that a high-speed current signal applied between contacts 1307 and 1308 results in a high-speed output beam 1309 with intensity variations as a function of time that correspond to the current drive signal variations as a function of time. That is, the VCSEL device bandwidth is sufficiently high that a current signal with a high modulation bandwidth is translated into a similarly high-bandwidth modulation on the optical beam. In some embodiments, the device modulation bandwidth is 25 GHz or higher. In other embodiments, the device modulation bandwidth is 40 GHz or higher. In yet other embodiments, the device modulation bandwidth is 100 GHz or higher. In yet other embodiments, the device modulation bandwidth is 1 THz or higher. One skilled in the art will appreciate that the high-speed VCSEL device using only sub-wavelength gratings for the top and bottom reflectors can also be made as a bottom-emitting VCSEL.

Thus, one feature of VCSEL devices of the present teaching is that the replacement of one or more DBR grating reflectors with one or more sub-wavelength grating reflectors results in a thinner VCSEL device. The DBR mirrors are the highest resistivity part of prior art VCSELs, and typically comprise 80% of the resistance of the device. Replacement of the DBR mirrors with sub-wavelength gratings will significantly reduce the overall resistance of the device and, therefore, significantly reduce the RC time constant and increase the speed of the device. The high-speed VCSEL device thickness can be reduced even further by completely replacing both DBR reflectors by sub-wavelength gratings as described in connection with FIG. 13.

Another feature of the VCSEL devices of the present teaching is providing efficient optical coupling of the VCSEL output to integrated optics waveguides. The optical coupling techniques of the present teaching enable direct flip-chip bonding of the VCSEL to the waveguide substrate that enable compact low-cost modules. Further levels of integration are also realized by flip-chip bonding a high speed detector to the waveguide substrate using similar coupling mechanisms. In this way, a compact Transmit/Receive (Tx/Rx) high-speed module can be made which is suitable for direct coupling to a fiber optic link. It will be apparent to those skilled in the art that the methods and apparatus of the present teaching that provide efficient coupling of the VCSEL output to integrated optics waveguides can be applied to lower-speed VCSEL device designs.

To provide efficient coupling to integrated optics waveguides, a sub-wavelength grating is placed above the top DBR output mirror. The sub-wavelength grating is used to couple the output from the high-speed VCSEL into a waveguide. Many applications of high-speed VCSELs are to transmit high-speed data over optical fibers or waveguides. One feature of VCSELs is that they produce a round output beam that makes it easier to couple the output beam into a round waveguide. Prior art semiconductor lasers, such as edge-emitting semiconductor lasers, typically have an elliptically shaped output beam. In devices where the laser output beam is not round, additional optical components, such as one or more lenses, and additional alignment procedures are required to couple the output beam into an optical fiber or waveguide.

Figure 14:
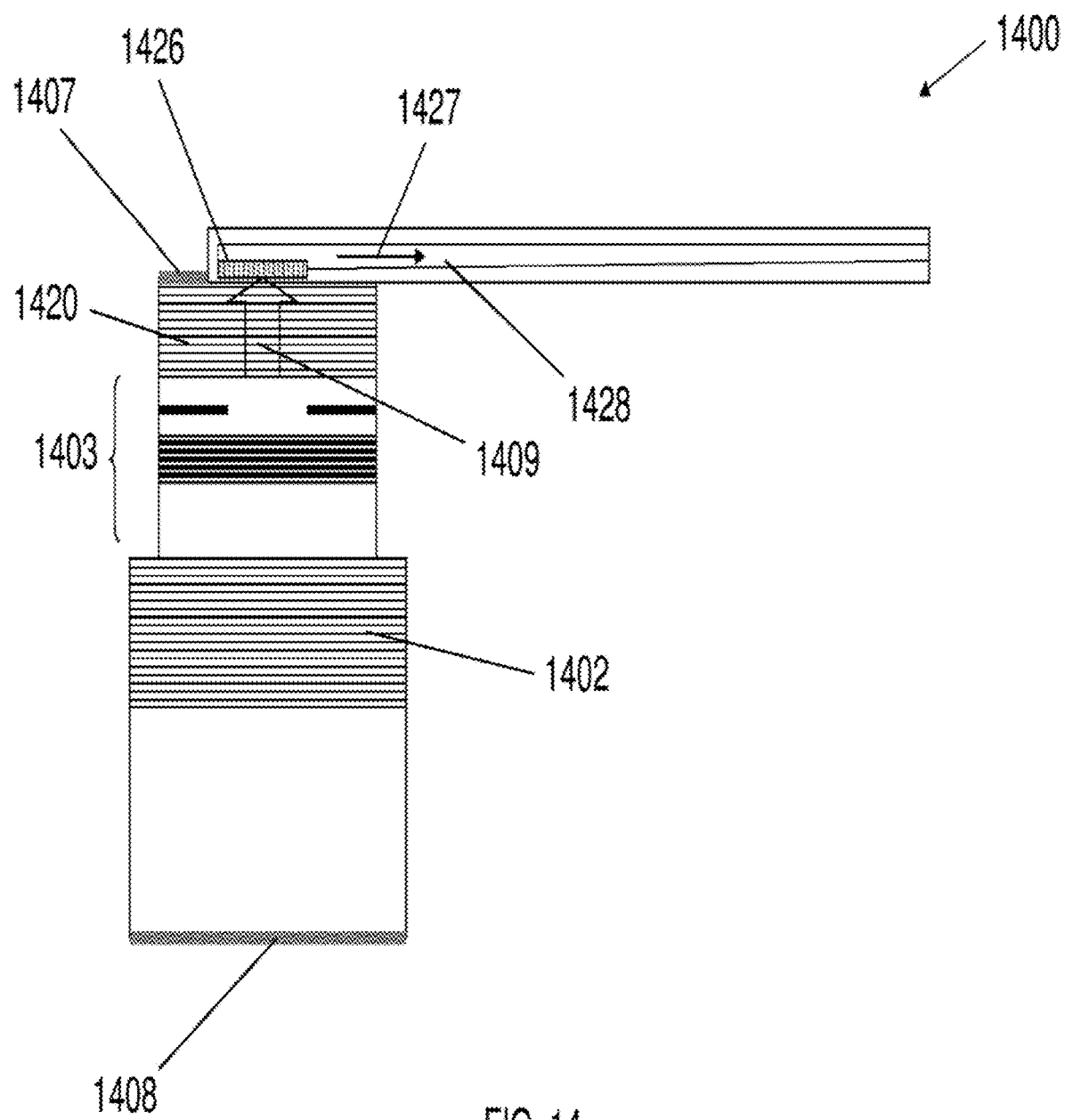
FIG. 14 illustrates a schematic diagram of an embodiment of a top-emitting VCSEL device with integrated waveguide according to the present teaching.

FIG. 14 illustrates a schematic diagram of an embodiment of a top-emitting VCSEL device 1400 according to the present teaching. As described in connection with the description of FIG. 7, the sub-wavelength grating 1426 acts to couple radiation into modes along the grating 1426. Some of the modes are then coupled back out to form the normal reflected beam that is directed to the gain region 1403. However, the grating parameters can be adjusted so that some of the coupled radiation 1427 is propagated into an optical waveguide 1428 which is located proximate to the grating. In some embodiments, the sub-wavelength grating 1426 is fabricated on the DBR mirror 1420.

The top reflector of the top-emitting VCSEL device 1400 comprises a DBR mirror 1420 and sub-wavelength grating 1426. The partial reflectivity of the combined DBR mirror 1420 and grating 1426 is designed to produce optimum laser operation with the bottom high-reflecting DBR mirror 1402 and the multiple quantum well groups in gain region 1403. The output beam 1409 of the laser cavity mode from the partial reflector 1420, 1426 is coupled into the waveguide 1428 by the sub-wavelength grating 1426. The coupled light from output beam 1409 becomes coupled radiation 1427 that propagates through the waveguide 1428. The gain region 1403 is activated in the same way as described for the other embodiments, by applying a current to the contacts 1407 and 1408.

One feature of the present teaching is the use of a sub-wavelength grating with a high-gain VCSEL to produce a three-mirror external-cavity high-speed VCSEL while also coupling radiation from the output portion of the VCSEL lasing cavity mode into a waveguide. Coupling using a sub-wavelength grating can be done from the waveguide to a detector as well.

Figure 15:
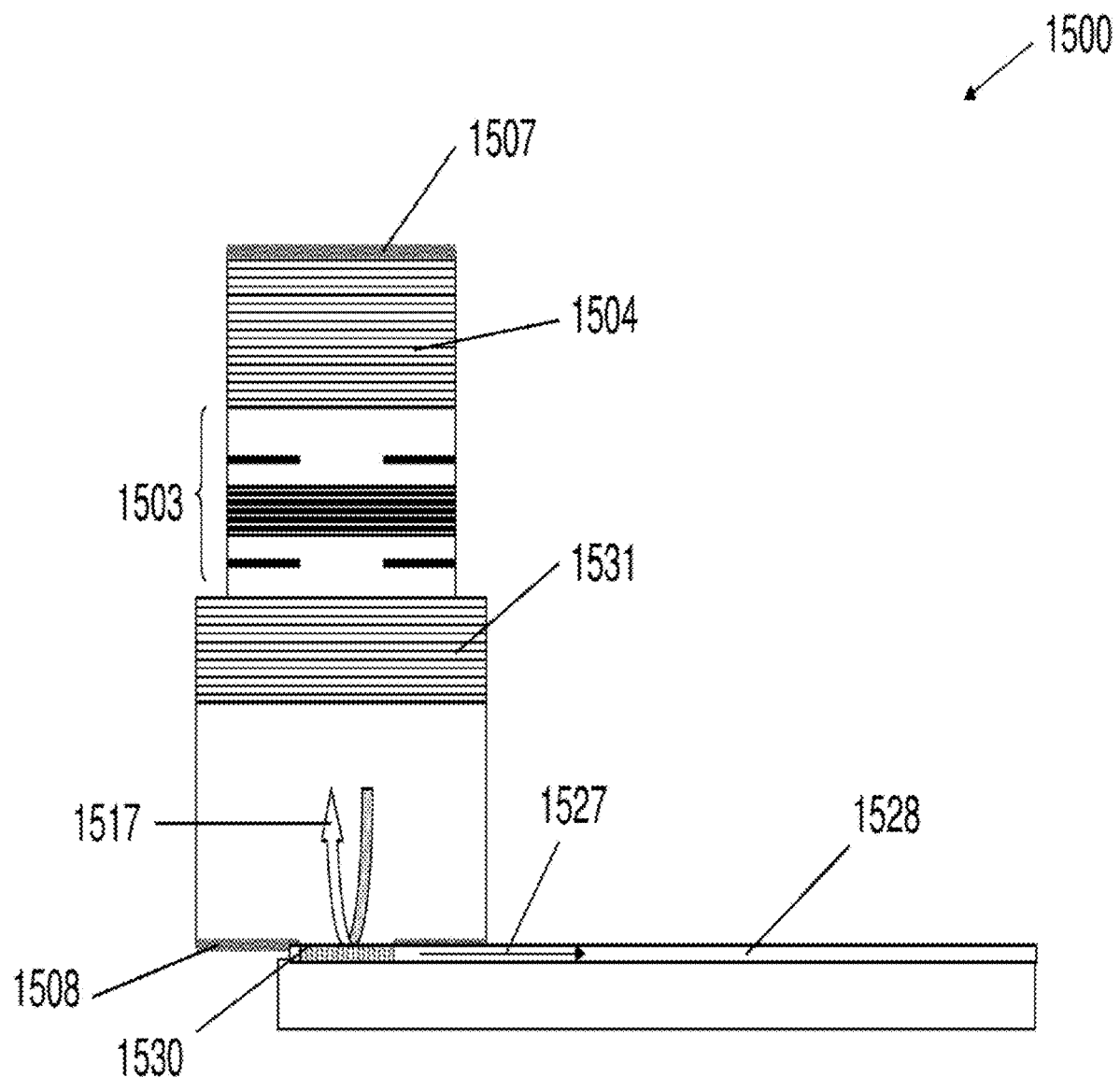
FIG. 15 illustrates a schematic diagram of an embodiment of a three-mirror extended-cavity VCSEL according to the present teaching.

FIG. 15 illustrates a schematic diagram of an embodiment of a three-mirror extended-cavity VCSEL device 1500 according to the present teaching. In this embodiment, a sub-wavelength grating 1530 is configured as the third cavity mirror that couples the laser light 1517 into a waveguide 1528 to generated coupled light 1527 that propagates along the waveguide 1528. The bottom-emitting-VCSEL-laser three-mirror cavity comprises a high reflecting DBR for the top mirror 1504, the partial reflecting DBR bottom mirror 1531 as the middle mirror, and the partial-reflecting sub-wavelength grating 1530 for the third mirror. Multiple groups of multiple quantum wells comprise the gain section 1503 that is located between the DBR mirrors 1504, 1531. When activated by applying a current between top and bottom contacts 1507, 1508, the gain section 1503 generates laser action in the three-mirror cavity. The laser light 1517 is coupled by the partially reflecting sub-wavelength grating 1530 into the waveguide 1528 to generate coupled light 1527. This embodiment provides high-speed VCSEL operation with the advantages of higher brightness from the three-mirror cavity. This results in higher-power coupling into a lower-order or single-mode waveguide.

Figure 16:
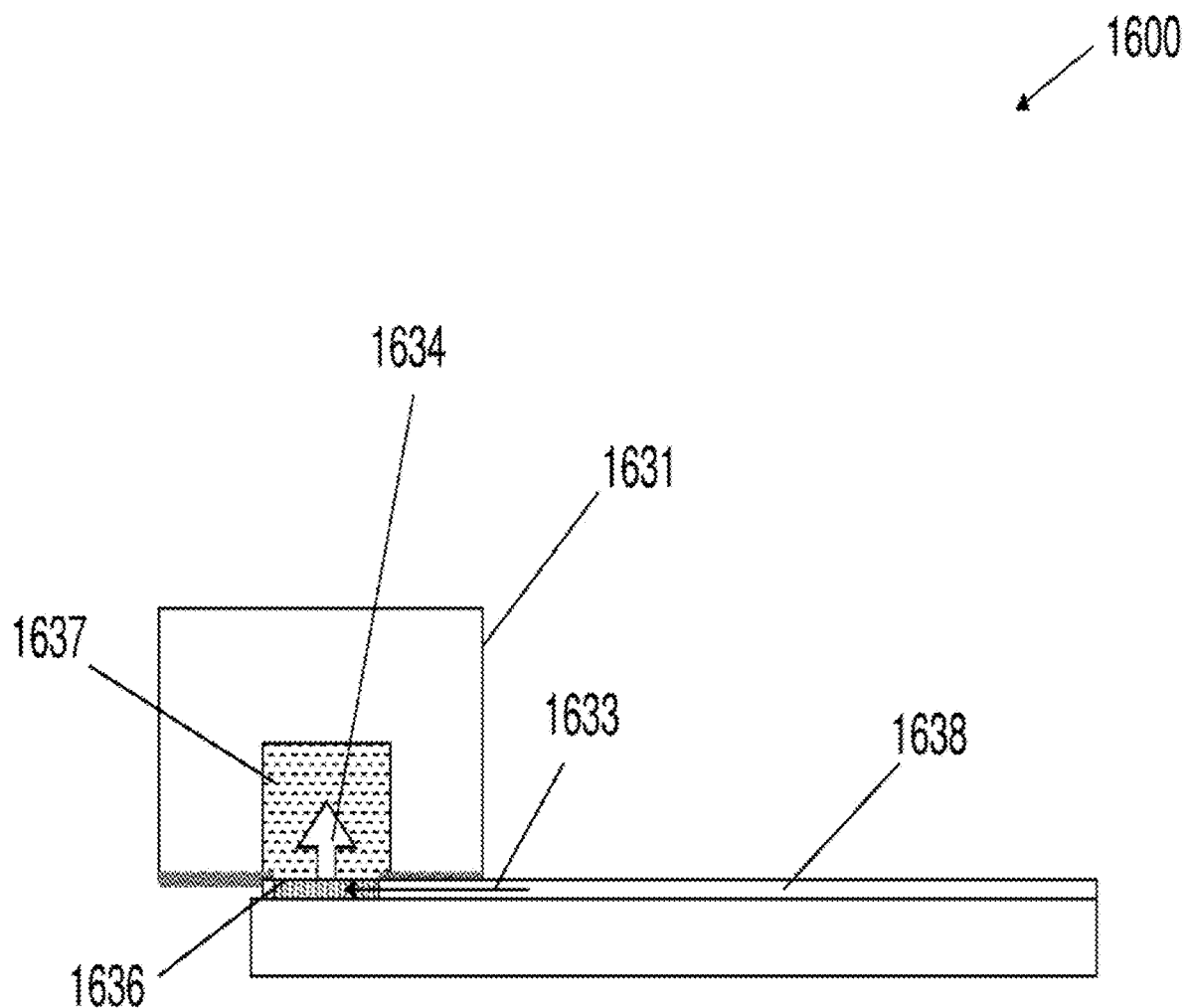
FIG. 16 illustrates a schematic diagram showing an embodiment of a waveguide coupled to a detector according to the present teaching.

FIG. 16 illustrates a schematic diagram showing a waveguide coupled to a detector 1600 according to the present teaching. In the waveguide coupled to the detector 1600, the radiation 1633 propagating in waveguide 1638 is coupled out of the waveguide 1638 into an optical detector 1631. Specifically, a grating coupler 1636 is used to couple the radiation 1633 out of a waveguide 1638 to form output light 1634 that impinges into the sensing region 1637 of a detector 1631. The output light 1634 may also be directed to free space or other optical apparatus (not shown). The grating coupler 1636 may comprise a sub-wavelength grating. The grating coupler 1636 is located in the waveguide 1638. In some embodiments, the grating coupler can also be formed in the detector top surface. In general, the grating can be fabricated into the waveguide or the grating region may be fabricated on the detector and the grating region inserted as part of the waveguide.

Figure 17:
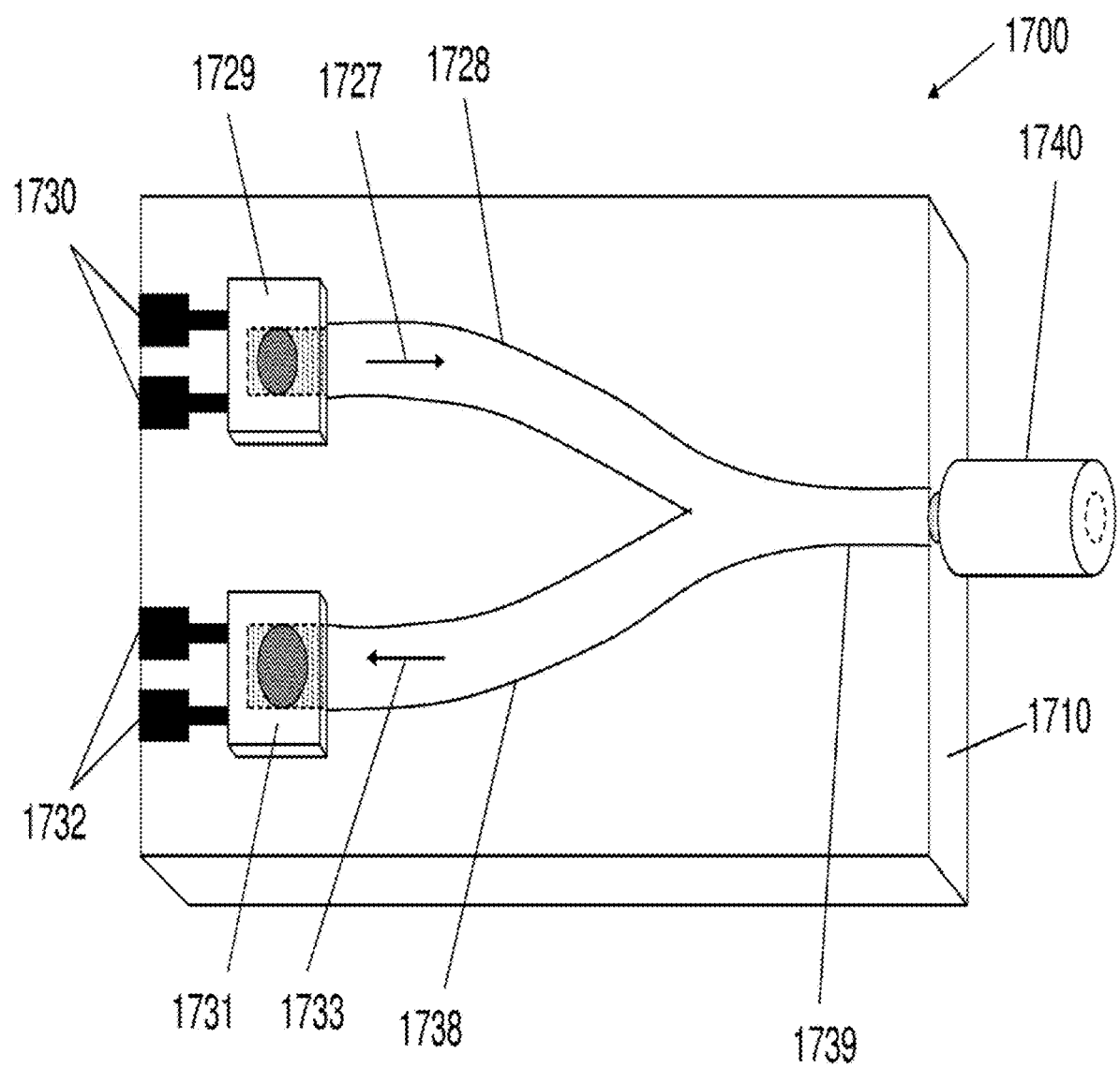
FIG. 17 illustrates a schematic diagram of an embodiment of a waveguide Tx/Rx module according to the present teaching.

One feature of the present teaching is the production of compact integrated optical modules that perform multiple functions. FIG. 17 illustrates a schematic diagram of an embodiment of a waveguide Tx/Rx module 1700 according to the present teaching. The module 1700 is made by assembling a high-speed, high-power VCSEL 1729 and a detector 1731 on a waveguide substrate 1710. Sub-wavelength gratings are used for coupling to and from waveguides 1728, 1738. In this layout, the waveguides 1728, 1738 and 1739 form a Y coupler that provides two-way communication of light into a fiber 1740. In various embodiments, various types of splitters can be used to separate the incoming and outgoing beams. The detector 1731 will also be waveguide/grating coupled to waveguide 1738 in a similar way. Direct coupling of the high-speed, high-power VCSEL 1729 into a waveguide 1728 enables compact integrated optic modules to be assembled. The module 1700 is a bi-directional Tx/Rx datalink module which transmits data in both directions along an optical fiber 1740.

The module 1700 comprises a Y-waveguide splitter which couples beams to or from waveguides 1728 and 1738 into a single waveguide 1739. The single waveguide 1739 is then coupled into the optical fiber 1740. A high-speed VCSEL 1729 output is coupled into the transmit waveguide 1728 of the Y-splitter using the sub-wavelength grating to produce transmit optical beam 1727. The VCSEL electrical contacts are connected to circuit lines which connect to electrical pads 1730. Applying current to the pads 1730 activates the VCSEL 1729. The output laser beam is coupled into the waveguide 1728 to produce a transmit optical beam 1727 that is propagated into the optical fiber 1740. The transmit optical beam 1727 propagates in the opposite direction in the optical fiber 1740 coupled into the waveguide 1739 and is directed by the splitter into the waveguide 1738 to produce the receive optical beam 1733. The receive optical beam 1733 is coupled into detector 1731 by a grating coupler attached to the waveguide 1738. The detector 1731 produces electrical signals from the coupled laser beam and these electrical signals are provided by circuit lines to electrical pads 1732.

One feature of the present teaching is to provide efficient coupling of a high-speed VCSEL array to a fiber array. The VCSEL array can be coupled into the fiber array using sub-wavelength gratings that couple into an integrated optic waveguide array which in turn is connected to a fiber array.

Figure 18:
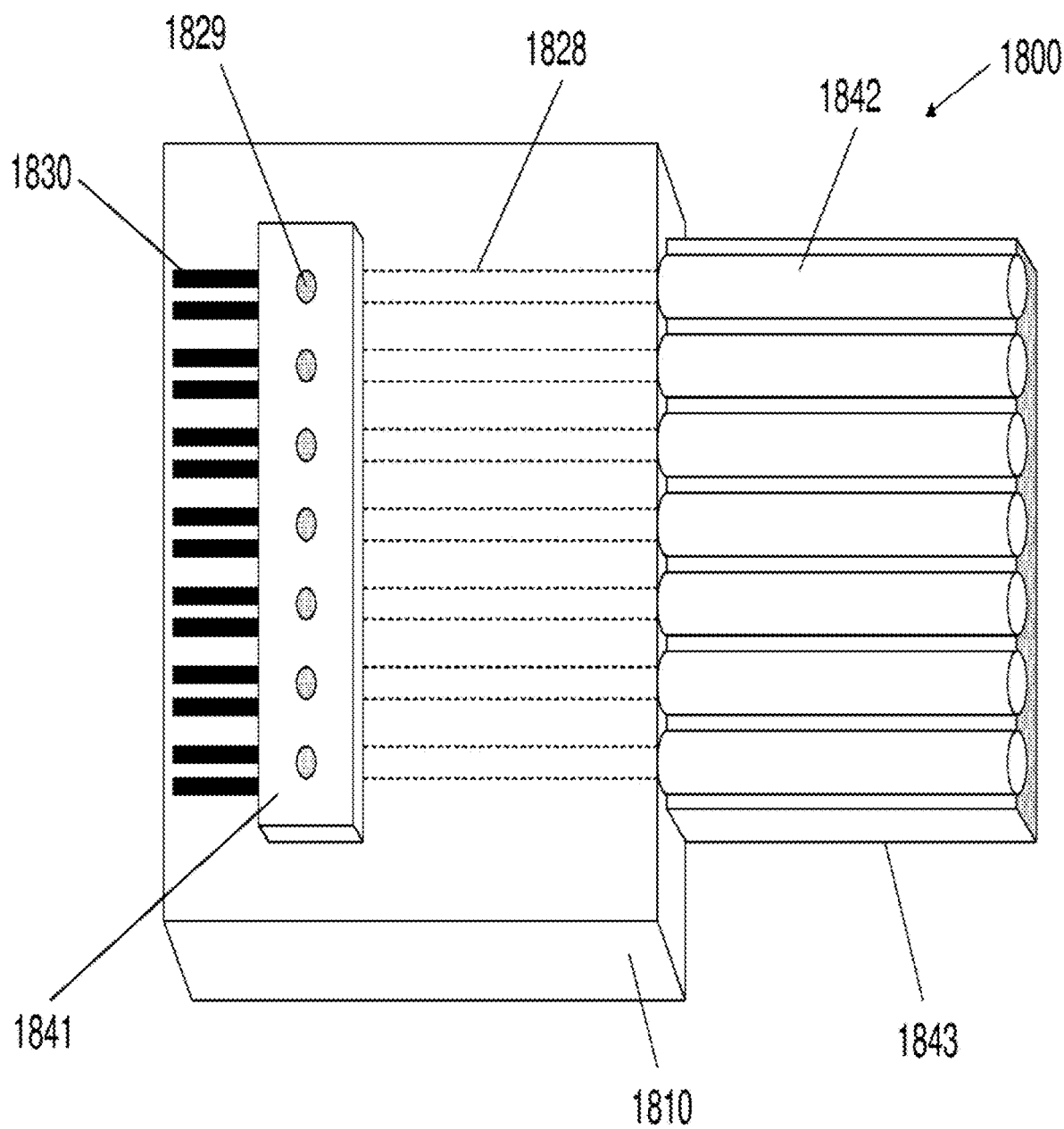
FIG. 18 illustrates a schematic diagram of an embodiment of a VCSEL array coupled to a fiber array according to the present teaching.

FIG. 18 illustrates a schematic diagram of an embodiment of a VCSEL array coupled to a fiber array 1800 according to the present teaching. In this embodiment, a high-speed array transmitter module is fabricated using a high-speed VCSEL linear array 1841. The VCSEL linear array 1841 is located on a substrate 1810 comprising waveguides 1828. The VCSEL linear array 1841 contains high-speed VCSELs 1829 which incorporate sub-wavelength grating reflectors which provide coupling of the output laser beams into the waveguides 1828. In some embodiments, each sub-wavelength grating reflector couples a respective high-speed VCSEL 1829 to a respective waveguide 1828. The waveguides 1828 are aligned to fibers 1842 in a fiber array assembly 1843.

Application of electrical current signals to each pair of contacts 1830 activates the VCSELs 1829 in the VCSEL linear array 1841 generating optical beams which are propagated into the fibers 1842. In some embodiments, a respective contact 1830 is connected to a respective VCSEL 1829. As is known in the art, the VCSEL elements in the array may be driven selectively, individually, or collectively in various groups, depending on the application.

VCSELs are surface emitting devices. It is known in the art that VCSEL devices can be fabricated into one-dimensional and two-dimensional arrays. The high-speed, high-power VCSELs described herein are highly compatible with standard VCSEL array configurations. Thus, arrays of high-speed VCSEL devices can be fabricated. This greatly simplifies and reduces the cost of testing large quantities of devices. In addition integrated module arrays can be assembled which can be coupled into fiber arrays further reducing the cost of high-speed communication systems.

It will be apparent to those skilled in the art that various high-speed multiple quantum well group VCSELs and VCSEL array configurations and types can be used for many different high-speed laser applications using the embodiments described herein or variations thereof that are within the spirit of the present teaching. This includes VCSELs with different quantities of groups with multiple quantum wells. In particular, although a broad framework of the invention is described with reference to a few preferred embodiments, other embodiments may be configured by applying combinations and sub-combinations of elements described herein, depending on the particular VCSELs or VCSEL arrays required for the high-speed laser application. Variations and modifications of different embodiments, both with and without sub-wavelength grating reflectors, are within the scope of the present teachings.

EQUIVALENTS

While the Applicant's teaching is described in conjunction with various embodiments, it is not intended that the Applicant's teaching be limited to such embodiments. On the contrary, the Applicant's teaching encompass various alternatives, modifications, and equivalents, as will be appreciated by those of skill in the art, which may be made therein without departing from the spirit and scope of the teaching.

We claim:

1. A Vertical Cavity Surface Emitting Laser (VCSEL) comprising:
　a) a reflecting surface of the VCSEL;
　b) a gain region positioned on the reflective surface that generates optical gain, the gain region comprising:
　　i. a first and a second multiple quantum well stack;
　　ii. a tunnel junction positioned between the first and second multiple quantum well stack; and
　　iii. a current aperture positioned on one of the first and second multiple quantum well stack, the current aperture confining a current flow in the gain region; and c) a partially reflective surface, the reflective surface, and the partially reflective surface forming a VCSEL resonant cavity, wherein an output optical beam propagates from the partially reflecting surface, d) a first electrical contact formed between a semiconductor substrate and the reflecting surface and a second electrical contact formed on the partially reflecting surface for applying electrical current to activate the VCSEL, wherein the first and second electrical contacts are on a same side of the semiconductor substrate and the first and second electrical contacts are separated by the gain region and the reflecting surface of the VCSEL, wherein the reflecting surface and the partially reflective surface includes a sub-wavelength grating structure, wherein the sub-wavelength grating structure includes a plurality of three-dimensional stripes, wherein the sub-wavelength grating structure is reflective for one direction of linear polarization, wherein the direction of linear polarization of the reflecting surface and the direction of linear polarization of the partially reflective surface are aligned, wherein a laser cavity mode of the VCSEL resonant cavity includes a node positioned at the tunnel junction, and wherein the laser cavity mode of the VCSEL resonant cavity includes an anti-node positioned at the first and the second multiple quantum well stack.

2. The VCSEL of claim 1 wherein the reflecting surface further comprises a distributed Bragg reflector.

3. The VCSEL of claim 1 wherein the partially reflecting surface further comprises a distributed Bragg reflector.

4. The VCSEL of claim 3 further comprising a waveguide positioned proximate to the sub-wavelength grating structure that couples the output optical beam propagating from the partially reflecting surface.

5. The VCSEL of claim 4 wherein the waveguide comprises a planar waveguide.

6. The VCSEL of claim 1 wherein the reflecting surface is positioned between the semiconductor substrate and the partially reflecting surface.

7. The VCSEL of claim 1 further comprising a second partially reflecting surface comprising a sub-wavelength grating positioned adjacent to the partially reflecting surface, wherein the reflecting surface, the partially reflecting surface, and the second partially reflecting surface form an extended-cavity VCSEL.

8. The VCSEL of claim 7 wherein the sub-wavelength grating of the second partially reflecting surface couples into a waveguide.

9. The VCSEL of claim 1 wherein the second electrical contact includes a laser aperture for transmitting the VCSEL output optical beam.

10. The VCSEL of claim 1 wherein the current aperture comprises an oxidized semiconductor layer.

11. The VCSEL of claim 1 wherein the current aperture comprises a high resistivity semiconductor layer formed by ion implantation.

12. The VCSEL of claim 1 further comprising a second current aperture positioned on the other of the first and second multiple quantum well stack, the second current aperture confining the current flow in the gain region.

13. The VCSEL of claim 1 wherein the gain region further comprises a third multiple quantum well stack and a second tunnel junction positioned between the second and the third quantum well stack.

14. The VCSEL of claim 13 wherein the gain region further comprises a fourth multiple quantum well stack and a third tunnel junction positioned between the third and fourth quantum well stack.

15. The VCSEL of claim 1 wherein each three-dimensional stripe of the plurality of three-dimensional stripes includes layer structures with different refractive index.

16. A top emitting Vertical Cavity Surface Emitting Laser (VCSEL) comprising:

a) a high reflecting distributed Bragg reflector epitaxially grown on a semiconductor substrate;

b) a gain region that generates optical gain comprising multiple semiconductor layers epitaxially grown above the high reflecting distributed Bragg reflector, the gain region comprising:
 i. a first and a second multiple quantum well stack;
 ii. a tunnel junction positioned between the first and second multiple quantum well stack; and
 iii. a current aperture positioned on one of the first and second multiple quantum well stack, the current aperture confining a current flow in the gain region;

c) a partially reflecting distributed Bragg reflector epitaxially grown above the gain region to form a VCSEL resonant cavity with the high reflecting distributed Bragg reflector, wherein an output optical beam propagates from the partially reflecting distributed Bragg reflector;

d) a bottom electrical contact formed on the semiconductor substrate; and e) a top electrical contact formed on the partially reflecting distributed Bragg reflector, the top and bottom electrical contacts configured to receive an electrical current that activates the VCSEL, the VCSEL further comprising a sub-wavelength grating structure positioned adjacent to the partially reflecting distributed Bragg reflector, wherein the sub-wavelength grating structure includes a plurality of three-dimensional stripes, wherein the sub-wavelength grating structure is reflective for one direction of linear polarization, wherein a laser cavity mode of the VCSEL resonant cavity includes a node positioned at the tunnel junction, and wherein the laser cavity mode of the VCSEL resonant cavity includes an anti-node positioned at the first and the second multiple quantum well stack.

17. The top emitting VCSEL of claim 16 wherein the top electrical contact comprises a laser aperture for transmitting the optical beam from the partially reflecting distributed Bragg reflector.

18. The top emitting VCSEL of claim 16 further comprising a waveguide positioned proximate to the sub-wavelength grating structure that couples the output optical beam propagating from the partially reflecting distributed Bragg reflector.

19. The top emitting VCSEL of claim 18 wherein the waveguide comprises a planar waveguide.

20. The top emitting VCSEL of claim 16 wherein the current aperture comprises an oxidized semiconductor layer.

21. The top emitting VCSEL of claim 16 wherein the current aperture comprises a high resistivity semiconductor layer.

22. The top emitting VCSEL of claim 16 further comprising a second current aperture positioned on the other of the first and second multiple quantum well stack, the second current aperture confining the current flow in the gain region.

23. A bottom emitting Vertical Cavity Surface Emitting Laser (VCSEL) comprising:
   a) a partially reflecting distributed Bragg reflector epitaxially grown on a semiconductor substrate;
   b) a gain region that generates optical gain comprising multiple semiconductor layers epitaxially grown above the partially reflecting distributed Bragg reflector, the gain region comprising:
      i. a first and a second multiple quantum well stack;
      ii. a tunnel junction positioned between the first and second multiple quantum well stack; and
      iii. an aperture positioned on one of the first and second multiple quantum well stack, the aperture confining a current flow in the gain region;
   c) a high reflecting distributed Bragg reflector epitaxially grown above the gain region to form a VCSEL resonant cavity with the partially reflecting distributed Bragg reflector, wherein an output optical beam propagates from the partially reflecting distributed Bragg reflector through the semiconductor substrate;
   d) a bottom electrical contact formed on the substrate; and
   e) a top electrical contact formed on the high reflecting distributed Bragg reflector, the top and bottom electrical contracts configured to receive an electrical current that activates the VCSEL,
   the VCSEL further comprising a sub-wavelength grating structure is positioned adjacent to the high reflecting distributed Bragg reflector and adjacent to the partially reflecting distributed Bragg reflector,
   wherein the sub-wavelength grating structure includes a plurality of three-dimensional stripes,
   wherein the sub-wavelength grating structure is reflective for one direction of linear polarization,
   wherein the direction of linear polarization of the reflecting surface and the direction of linear polarization of the partially reflective surface are aligned,
   wherein a laser cavity mode of the VCSEL resonant cavity includes a node positioned at the tunnel junction, and
   wherein the laser cavity mode of the VCSEL resonant cavity includes an anti-node positioned at the first and the second multiple quantum well stack.

24. The bottom emitting VCSEL of claim 23 further comprising a waveguide positioned proximate to the sub-wavelength grating structure that couples the output optical beam propagating from the partially reflecting distributed Bragg reflector.

25. The bottom emitting VCSEL of claim 24 wherein the waveguide comprises a planar waveguide.

26. The bottom emitting VCSEL of claim 23 wherein the current aperture comprises an oxidized semiconductor layer.

27. The bottom emitting VCSEL of claim 23 wherein the current aperture comprises a high resistivity semiconductor layer.

28. The bottom emitting VCSEL of claim 23 further comprising a second current aperture positioned on the other of the first and second multiple quantum well stack, the second current aperture confining the current flow in the gain region.

* * * * *